US011437977B2

(12) United States Patent
Kim et al.

(10) Patent No.: US 11,437,977 B2
(45) Date of Patent: Sep. 6, 2022

(54) BULK-ACOUSTIC RESONATOR AND ELASTIC WAVE FILTER DEVICE

(71) Applicant: Samsung Electro-Mechanics Co., Ltd., Suwon-si (KR)

(72) Inventors: Tae Yoon Kim, Suwon-si (KR); Won Han, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 431 days.

(21) Appl. No.: 16/662,473

(22) Filed: Oct. 24, 2019

(65) Prior Publication Data

US 2020/0195223 A1 Jun. 18, 2020

(30) Foreign Application Priority Data

Dec. 14, 2018 (KR) ........................ 10-2018-0162336
Jul. 22, 2019 (KR) ........................ 10-2019-0088410

(51) Int. Cl.
*H03H 9/17* (2006.01)
*H03H 9/13* (2006.01)
*C23C 16/44* (2006.01)
*H03H 9/54* (2006.01)
*H03H 3/04* (2006.01)

(52) U.S. Cl.
CPC ............ *H03H 9/174* (2013.01); *C23C 16/44* (2013.01); *H03H 9/13* (2013.01); *H03H 9/54* (2013.01); *H03H 2003/0435* (2013.01)

(58) Field of Classification Search
CPC . C23C 16/44; H03H 9/13; H03H 9/54; H03H 2003/0435
USPC .......................................................... 333/187
See application file for complete search history.

(56) References Cited

U.S. PATENT DOCUMENTS 6,839,946 B2 * 1/2005 Ylilammi ................. H03H 3/02 29/25.35
2010/0033063 A1 2/2010 Nishihara et al.
2015/0171826 A1 6/2015 Sakashita et al.
2017/0257076 A1 9/2017 Kaneko et al.
(Continued)

FOREIGN PATENT DOCUMENTS

JP 2010-45437 A 2/2010
JP 2015-119249 A 6/2015
(Continued)

*Primary Examiner* — Hafizur Rahman
(74) *Attorney, Agent, or Firm* — NSIP Law

(57) ABSTRACT

A bulk-acoustic resonator includes: a substrate; a first electrode disposed on the substrate; a piezoelectric layer at least partially covering the first electrode, and including a flat portion disposed in a central region, and an extension portion disposed outside the flat portion and having at least one step portion; an insertion layer disposed on the extension portion; and a second electrode disposed on upper portions of the insertion layer and the piezoelectric layer. The extension portion includes at least one first surface and at least one second surface disposed below an upper surface of the flat portion, and a connection surface connecting an upper surface of the flat portion to the at least one first surface or the at least one second surface, or connecting first surfaces among the at least one first surface to each other or second surfaces among the at least one second surface to each other.

20 Claims, 20 Drawing Sheets

(56) References Cited

U.S. PATENT DOCUMENTS

| | | | |
|---|---|---|---|
| 2018/0205360 | A1 | 7/2018 | Han et al. |
| 2018/0254764 | A1 | 9/2018 | Lee et al. |

FOREIGN PATENT DOCUMENTS

| | | | |
|---|---|---|---|
| JP | 2017-158161 | A | 9/2017 |
| KR | 10-2017-0020835 | A | 2/2017 |
| KR | 10-2018-0084593 | A | 7/2018 |
| KR | 10-2018-0101129 | A | 9/2018 |

* cited by examiner

BULK-ACOUSTIC RESONATOR AND ELASTIC WAVE FILTER DEVICE

CROSS-REFERENCE TO RELATED APPLICATIONS

This application claims the benefit under 35 U.S.C. § 119(a) of Korean Patent Application Nos. 10-2018-0162336 and 10-2019-0088410 filed on filed on Dec. 14, 2018 and Jul. 22, 2019, respectively, in the Korean Intellectual Property Office, the entire disclosures of which are incorporated herein by reference for all purposes.

BACKGROUND

1. Field

The following description relates to a bulk-acoustic resonator and an elastic wave filter device.

2. Description of Related Art

As wireless communication devices are becoming more compact, there is ever-increasing demand for the miniaturization of high-frequency components. As an example, a filter is provided in the form of a bulk-acoustic resonator, or bulk-acoustic wave (BAW) resonator, employing semiconductor thin-film wafer manufacturing technology.

A BAW resonator is a filter implemented using a thin-film device causing resonance using piezoelectric characteristics obtained through a piezoelectric dielectric material being deposited on a semiconductor substrate, such as a silicon wafer.

Examples of applications of a BAW resonator include mobile communication devices, compact lightweight filters for chemical and biological devices, oscillators, resonant elements, acoustic resonant mass sensors, and the like.

Various structural shapes and functions are being researched in order to enhance the characteristics and performance of BAW resonators. Accordingly, methods for manufacturing BAW resonators are also being continuously researched.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic resonator includes: a substrate; a first electrode disposed on an upper portion of the substrate; a piezoelectric layer disposed to at least partially cover the first electrode, and including a flat portion disposed in a central region of the bulk-acoustic resonator, and an extension portion disposed outside the flat portion and having at least one step portion; an insertion layer disposed on the extension portion; and a second electrode disposed on upper portions of the insertion layer and the piezoelectric layer. The extension portion includes at least one first surface and at least one second surface disposed below an upper surface of the flat portion, and a connection surface connecting an upper surface of the flat portion to the at least one first surface or the at least one second surface, or connecting first surfaces among the at least one first surface to each other or second surfaces among the at least one second surface to each other.

A width of a portion of the insertion layer disposed at an end of the second electrode may be equal to or less than 1 μm.

A thickness of a portion of the insertion layer disposed at an end of the second electrode may be equal to or less than half a thickness of the piezoelectric layer.

The at least one first surface may include one first surface having a step portion with an upper surface of the flat portion, and another first surface disposed below the one first surface and having a step portion with the one first surface. A separation distance between the one first surface and the other first surface in a thickness direction of the bulk-acoustic resonator may be equal to or less than a thickness obtained by subtracting a thickness of a portion of the insertion layer disposed at an end of the second electrode from a thickness of the piezoelectric layer.

A portion of the insertion layer disposed at an end of the second electrode may be formed to extend to the other first surface.

The connection surface may include a first connection surface connecting an upper surface of the flat portion to the one first surface, and a second connection surface connecting the one first surface to the other first surface. A portion of the insertion layer disposed at an end of the second electrode may be formed to extend to the second connection surface.

An end of the insertion layer disposed at an end of the second electrode may be disposed on the first surface.

An end of the insertion layer disposed at an end of the second electrode may be disposed at an end of the one first surface.

An end of the insertion layer disposed at an end of the second electrode may be disposed on the one first surface.

The bulk-acoustic resonator may further include a protective layer disposed on at least the flat portion of the piezoelectric layer.

An end of one side of the protective layer may be disposed to cover ends of the second electrode and the insertion layer.

An end of one side of the protective layer may be aligned with ends of the second electrode and the insertion layer.

An end of one side of the protective layer may be disposed on the second electrode.

A portion of the insertion layer disposed at an end of the second electrode may be disposed to be spaced apart from the piezoelectric layer.

A width of a portion of the insertion layer disposed at an end of the second electrode may be equal to or less than 1 μm.

The second surface may include one second surface having a step portion with an upper surface of the flat portion, and another second surface disposed below the one second surface and having a step portion with the one second surface. A separation distance between the one second surface and the other second surface in a thickness direction may be equal to or less than a thickness obtained by subtracting a thickness of a portion of the insertion layer disposed at an end of the second electrode from a thickness of the piezoelectric layer.

A width of a portion of the insertion layer disposed on a portion of the one second surface disposed on an upper portion of an end of the first electrode may be equal to or less than 1 μm.

In another general aspect, an elastic wave filter device includes: a substrate; a first resonator including one first electrode disposed on an upper portion of the substrate, a first piezoelectric layer including a first flat portion disposed to at least partially cover the one first electrode and disposed in a central portion of the first resonator, and a first extension portion disposed outside the first flat portion and having at least one step portion, and one second electrode disposed on an upper portion of the first piezoelectric layer; a second resonator including another first electrode disposed on the upper portion of the substrate, a second piezoelectric layer including a second flat portion disposed to at least partially cover the other first electrode and disposed in a central portion of the second resonator, and a second extension portion disposed outside the second flat portion and having at least one other step portion, and another second electrode disposed on an upper portion of the second piezoelectric layer; and an insertion layer disposed in upper portions of the first and second extension portions and between the first piezoelectric layer and the second piezoelectric layer, and formed of a conductive material.

A portion of the insertion layer disposed between the first piezoelectric layer and the second piezoelectric layer may connect the one second electrode to the other first electrode.

A portion of the insertion layer disposed between the first piezoelectric layer and the second piezoelectric layer may be connected to the one second electrode and the other second electrode.

A portion of the insertion layer disposed between the first piezoelectric layer and the second piezoelectric layer may connect the one first electrode to the other first electrode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
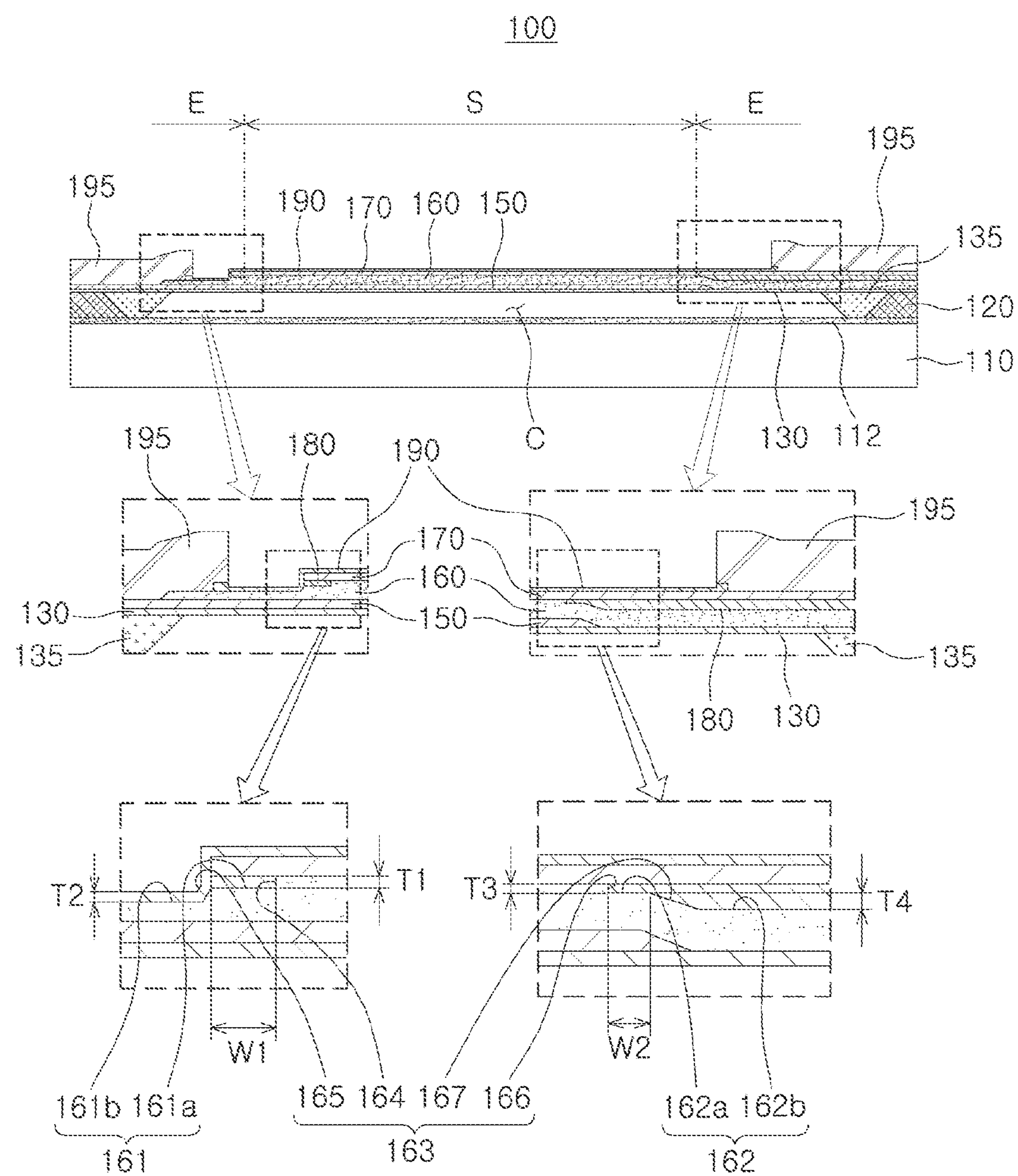
FIG. 1 is a schematic cross-sectional view illustrating a bulk-acoustic resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly “on,” “connected to,” or “coupled to” the other element, or there may be one or more other elements intervening therebetween. In contrast, when an element is described as being “directly on,” “directly connected to,” or “directly coupled to” another element, there can be no other elements intervening therebetween.

As used herein, the term “and/or” includes any one and any combination of any two or more of the associated listed items.

Although terms such as “first,” “second,” and “third” may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as “above,” “upper,” “below,” and “lower” may be used herein for ease of description to describe one element’s relationship to another element as shown in the figures. Such spatially relative terms are intended to encompass different orientations of the device in use or operation in addition to the orientation depicted in the figures. For example, if the device in the figures is turned over, an element described as being “above” or “upper” relative to another element will then be “below” or “lower” relative to the other element. Thus, the term “above” encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles “a,” “an,” and “the” are intended to include the plural forms as well, unless the context clearly indicates otherwise. The terms “comprises,” “includes,” and “has” specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

According to an aspect of the following disclosure, a bulk-acoustic resonator and an elastic wave filter device may have improved performance.

FIG. 1 is a schematic cross-sectional view illustrating a bulk-acoustic resonator 100, according to an embodiment.

Referring to FIG. 1, the bulk-acoustic resonator 100 may include a substrate 110, a sacrificial layer 120, a membrane layer 130, an etch-stop portion 135, a first electrode 150, a piezoelectric layer 160, a second electrode 170, an insertion layer 180, a protective layer 190, and a metal pad 195, for example.

The substrate 110 may be a silicon substrate. For example, a silicon wafer or a silicon-on-insulator (SOI) substrate may be used as the substrate 110.

An insulating layer 112 is disposed on an upper surface of the substrate 110, and may prevent the substrate 110 from being etched by an etching gas, when a cavity C is formed during a method of manufacturing the bulk-acoustic resonator 100. In this example, the insulating layer 112 may be formed of any one or any combination of any two or more of silicon dioxide ($SiO_2$), silicon nitride ($Si_3N_4$), aluminum oxide ($Al_2O_3$), and aluminum nitride (AlN), and may be formed on the substrate 110 through a process such as chemical vapor deposition, RF magnetron sputtering, or evaporation.

The sacrificial layer 120 is formed on the insulating layer 112, and the cavity C and the etch-stop portion 135 may be disposed in the sacrificial layer 120. The cavity C is formed by removing a portion of the sacrificial layer 120 during manufacturing. As described above, because the cavity C is formed in the sacrificial layer 120, the first electrode 150, which is formed on an upper portion of the sacrificial layer 120, may be formed to be flat.

The membrane layer 130 may form the cavity C together with the substrate 110. In addition, the membrane layer 130 may be formed of a material with low reactivity with an etching gas upon removal of the sacrificial layer 120. The etch-stop portion 135 is disposed in a lower portion of the membrane layer 130. The membrane layer 130 may be formed of a dielectric layer containing any one of silicon nitride ($Si_3N_4$), silicon oxide ($SiO_2$), manganese oxide (MnO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

A seed layer (not shown), formed of aluminum nitride (AlN), may be formed on the membrane layer 130. That is, the seed layer may be disposed between the membrane layer 130 and the first electrode 150. The seed layer may be formed using a dielectric or a metal, having a hexagonal close packed (HCP) crystal structure, in addition to aluminum nitride (AlN). As an example, when the seed layer is formed of the metal, the seed layer may be formed of titanium (Ti).

In addition, as an example, the membrane layer 130 may be formed of a seed layer. In such an example, a material of the membrane layer 130 may be a material having low reactivity with an etching gas.

The etch-stop portion 135 may be disposed along a boundary of the cavity C. The etch-stop portion 135 may prevent etching from proceeding into a cavity region during formation of the cavity C.

The first electrode 150 is formed on the membrane layer 140, and a portion of the first electrode 150 is disposed on an upper portion of the cavity C. In addition, the first electrode 150 may be used as either one of an input electrode and an output electrode, inputting and outputting, respectively, an electrical signal such as a radio frequency (RF) signal, or the like.

As an example, the first electrode 150 may be formed using a conductive material such as molybdenum (Mo) or alloys of molybdenum (Mo). However, the disclosure is not limited to such an example, and the first electrode 150 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy of ruthenium (Ru), tungsten (W), iridium (Ir), platinum (Pt), copper (Cu), titanium (Ti), tantalum (Ta), nickel (Ni), or chromium (Cr).

At least a portion of the piezoelectric layer 160 is disposed to cover the first electrode 150. The piezoelectric layer 160 has a flat portion S disposed in a central portion and an extension portion E disposed outside the flat portion S and having at least one step portion.

The extension portion E may have at least one first surface 161 and at least one second surface 162, disposed below an upper surface of the flat portion S, as well as a connection surface 163 connecting the upper surface of the flat portion S to the first surface 161 or the second surface 162, or connecting the first surfaces 161 to each other or the second surfaces 162 to each other.

The first surface 161 may have a first-1 surface 161*a* disposed at an end of one side of the second electrode 170 and having a step portion with the upper surface of the flat portion S, and a first-2 surface 161*b* disposed below the first-1 surface 161*a* and having a step portion with the first-1 surface 161*a*.

In addition, the second surface 162 may have a second-1 surface 162*a* disposed at an end of one side of the first electrode 150 and having a step portion with the upper surface of the flat portion S, and a second-2 surface 162*b* disposed below the second-1 surface 162*a* and having a step portion with the second-1 surface 162*a*.

The connection surface 163 has a first connection surface 164 connecting the upper surface of the flat portion S to the first-1 surface 161*a*, and a second connection surface 165 connecting the first-1 surface 161*a* to the first-2 surface 161*b*. Additionally, the connection surface 163 has a third connection surface 166 connecting the upper surface of the flat portion S to the second-1 surface 162*a*, and a fourth connection surface 167 connecting the second-1 surface 162*a* to the second-2 surface 162*b*.

A width W1 of the first-1 surface 161*a* may be equal to or less than 1 μm. In this regard, in more detail, as a width W1 of the insertion layer 180 is increased, an effective electromechanical coupling coefficient ($Kt^2$) of the bulk-acoustic resonator 100 may decrease. Thus, the width W1 should be maintained to be as small as possible. In addition, in order to improve attenuation performance of the bulk-acoustic resonator 100, a lateral wave λ having a short wavelength is required to be effectively reflected. To this end, a width W1 of a narrowest portion of an insertion layer 180 is λ/4. λ/4 values of most bulk-acoustic resonators may be less than 1 μm. Thus, an optimum width W1 of the insertion layer 180 may have a value equal to or less than 1 μm.

In addition, a separation distance T1 between the flat portion S and the first-1 surface 161*a* in a vertical direction is equal to or less than half a thickness of the piezoelectric layer 160. Additionally, the separation distance T2 between the first-1 surface 161*a* and the first-2 surface 161*b* in a vertical direction may be a thickness obtained by subtracting the separation distance T1 between the flat portion S and the first-1 surface 161*a* in a vertical direction from a thickness of the piezoelectric layer 160.

In addition, a width W2 of the second-1 surface 162*a* may be equal to or less than 1 μm. The basis for the width W2 is the same as the width W1 of the first-1 surface 161*a*.

T3, illustrated in FIG. 1, indicates a separation distance between the upper surface of the flat portion S and the second-1 surface 162*a* in a vertical direction. Further, T4, illustrated in FIG. 1, indicates a separation distance between the second-1 surface 162*a* and the second-2 surface 162*b* in a vertical direction. The separation distance T4 is the same as a thickness of the first electrode 150.

The piezoelectric layer 160 is a portion causing a piezoelectric effect to convert electrical energy into mechanical energy in the form of elastic waves, and may be formed of any one of aluminum nitride (AlN), zinc oxide (ZnO), and lead zirconium titanium oxide (PZT; PbZrTiO). For example, when the piezoelectric layer 160 is formed of aluminum nitride (AlN), the piezoelectric layer 160 may further include a rare earth metal. For example, the rare earth metal includes any one or any combination of any two or more of scandium (Sc), erbium (Er), yttrium (Y), and lanthanum (La). Additionally, for example, a transition metal includes any one or any combination of any two or more of titanium (Ti), zirconium (Zr), hafnium (Hf), tantalum (Ta), and niobium (Nb). Additionally, magnesium (Mg), which is a divalent metal, may be also included in the piezoelectric layer 160.

The second electrode 170 may be disposed on an upper portion of the piezoelectric layer 160. As an example, the second electrode 170 is formed to cover at least a portion of the piezoelectric layer 160 disposed on an upper portion of the cavity C. The second electrode 170 may be used as either one of an input electrode and an output electrode, inputting and outputting, respectively, an electrical signal such as an RF signal, or the like. In other words, when the first electrode 150 is used as an input electrode, the second electrode 170 may be used as an output electrode. Alternatively, when the first electrode 150 is used as an output electrode, the second electrode 170 may be used as an input electrode.

The second electrode 170 may be formed using a conductive material such as molybdenum (Mo) or alloys of molybdenum (Mo). However, the second electrode 170 is not limited to being formed of molybdenum (Mo) or alloys of molybdenum (Mo), and the first electrode 170 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy of ruthenium (Ru), tungsten (W), iridium (Ir), platinum (Pt), copper (Cu), titanium (Ti), tantalum (Ta), nickel (Ni), or chromium (Cr).

The insertion layer 180 is disposed on the extension portion E. As an example, a portion of the insertion layer 180 is disposed on a side of the first surface 161, while a remaining portion of the insertion layer 180 is disposed on a side of the second surface 162. In more detail, a portion of the insertion layer 180 is disposed on the first connection surface 164 and the first-1 surface 161*a*, while a remaining portion of the insertion layer 180 is disposed on a side of the second surface 162.

As an example, the insertion layer 180 may be formed of a dielectric material such as silicon oxide ($SiO_2$), aluminum nitride (AlN), aluminum oxide ($Al_2O_3$), silicon nitride ($Si_3N_4$), manganese oxide (MnO), zirconium oxide ($ZrO_2$), lead zirconate titanate (PZT), gallium arsenide (GaAs), oxide hafnium ($HfO_2$), aluminum oxide ($Al_2O_3$), titanium oxide ($TiO_2$), zinc oxide (ZnO), or the like, and may be formed of a material different from a material of the piezoelectric layer 160. Additionally, as an example, the insertion layer 180 may be formed of a metal, such as aluminum (Al), titanium (Ti), or the like, but may be formed of a material different from a material of the first electrode 150 and the second electrode 170.

In addition, a width W1 of the portion of the insertion layer 180 disposed at an end of the second electrode 170 may be equal to or less than 1 μm. That is, the width W1 of the portion of insertion layer 180 disposed on the first-1 surface 161*a* may be equal to or less than 1 μm.

Additionally, a thickness T1 of the portion of the insertion layer 180 disposed on the first-1 surface 161*a* may be equal to or less than half a thickness of the piezoelectric layer 160.

A width W2 of a portion of the insertion layer 180 disposed on the second-1 surface 162*a* may be equal to or less than 1 μm. In addition, a thickness T3 of the portion of the insertion layer 180 disposed on the second-1 surface 162*a* having the step portion with an upper surface of the flat portion S may be equal to or less than half a thickness of the piezoelectric layer 160.

Figure 2:
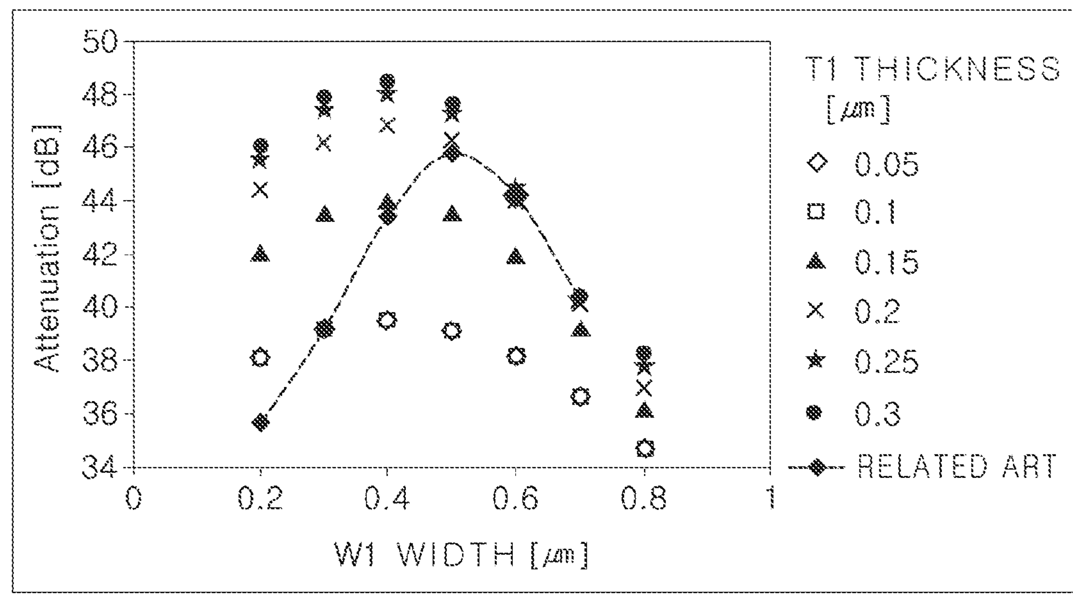
FIG. 2 is a graph illustrating attenuation performance of the bulk-acoustic resonator of FIG. 1 according to a width W1 of an insertion layer.

In this regard, in more detail, FIG. 2 is a graph illustrating attenuation performance numerically predicted by changing the width W1 of the portion of the insertion layer 180 disposed on the first-1 surface 161*a* when the thickness T1 of the insertion layer 180 is 0.05 μm to 0.3 μm, while a separation distance T2 between the first-1 surface 161*a* and the second surface 161*b* in a vertical direction is fixed.

As described above, when the width W1 of the insertion layer 180 is 0.4 μm while the thickness T1 of the insertion layer 180 is 0.3 μm, it is confirmed that attenuation performance is up to a maximum value of 48.5 (db). In addition, as compared with an example of the related art, when the width W1 of the insertion layer 180 is equal to or less than 0.5 μm while the thickness T1 of the insertion layer 180 is equal to or less than 0.2 μm, it is confirmed that attenuation performance is improved.

Figure 3:
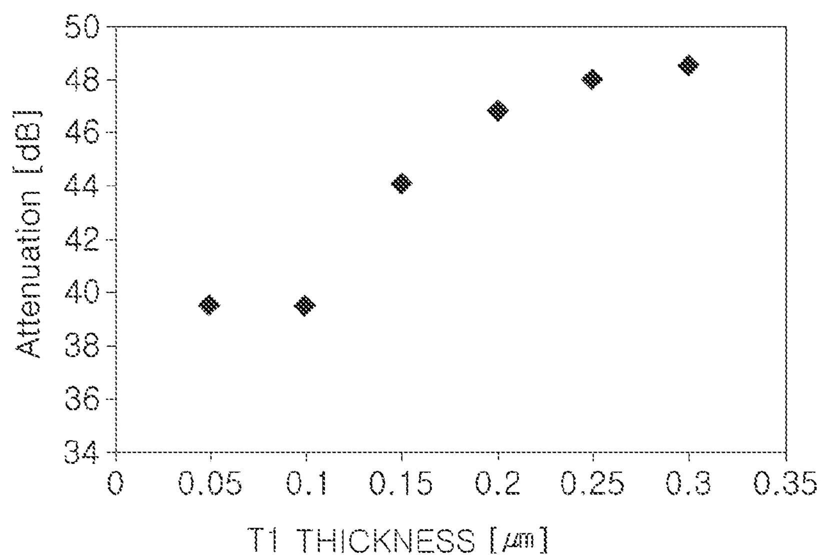
FIG. 3 is a graph illustrating attenuation performance of the bulk-acoustic resonator of FIG. 1 according to a thickness T1 of the insertion layer.

FIG. 3 is a graph illustrating a result in which attenuation performance is predicted when the thickness T1 of an insertion layer 180 is changed. As illustrated in FIG. 3, there is a tendency to reach saturation at around 0.3 μm of the thickness T1 of the insertion layer 180. The thickness T1 of the insertion layer 180, at which attenuation performance is saturated, may vary depending on a thickness of a thin film of a resonator and a combination of the thickness T1 and the thickness of the thin film. Here, usually, it is predicted that a saturation point of attenuation performance appears in a range which is equal to or less than half a thickness of the piezoelectric layer 160.

Figure 4:
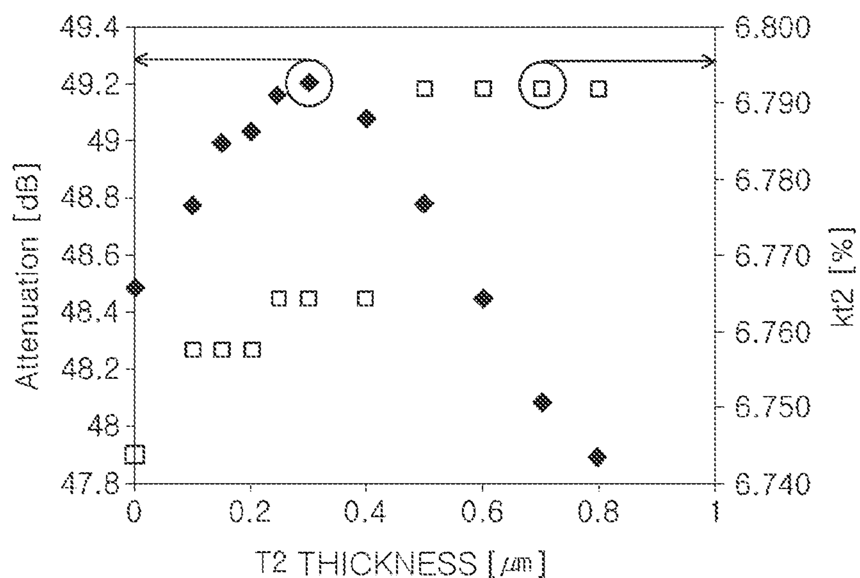
FIG. 4 is a graph illustrating attenuation performance and an effective electromechanical coupling coefficient ($Kt^2$) of the bulk-acoustic resonator of FIG. 1 according to a separation distance T2 between a first-1 surface and a first-2 surface in a vertical direction.

FIG. 4 is a graph illustrating attenuation performance and an effective electromechanical coupling coefficient ($Kt^2$) according to a change in the separation distance T2 between the first-1 surface 161*a* and the first-2 surface 161*b* in a vertical direction, when the thickness T1 of the insertion layer 180 is 0.3 μm.

As illustrated in FIG. 4, it is confirmed that attenuation performance has a maximum value when the separation distance T2 between the first-1 surface 161*a* and the first-2 surface 161*b* in a vertical direction is equal to 0.3 μm. Moreover, it is confirmed that an effective electromechanical coupling coefficient ($Kt^2$) is improved by 0.05% when the separation distance T2 between the first-1 surface 161*a* and the first-2 surface 161*b* in a vertical direction is equal to or greater than 0.5 μm.

Figure 5:
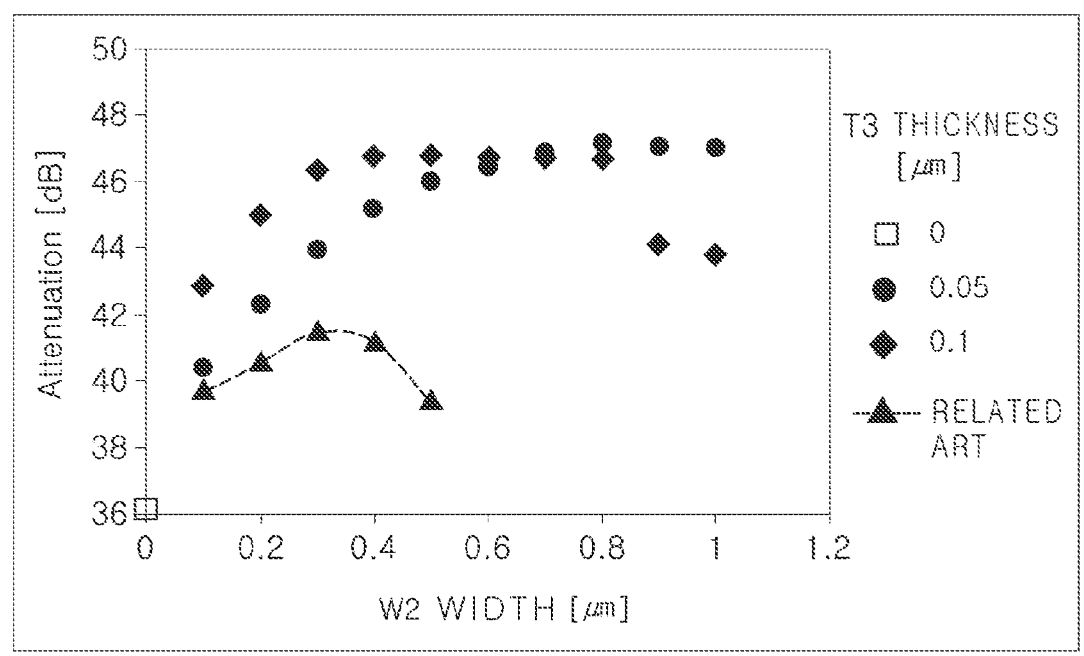
FIG. 5 is a graph illustrating attenuation performance of the bulk-acoustic resonator of FIG. 1 according to a width T3 of the insertion layer when a width W2 of the insertion layer is increased.

Meanwhile, FIG. 5 is a graph illustrating attenuation performance when the width W2 of the portion of the insertion layer 180 disposed on the second-1 surface 162*a* is increased, according to a thickness T3 of the portion of the insertion layer 180 disposed on the second-1 surface 162*a*. As illustrated in FIG. 5, it is confirmed that attenuation performance is 36.2 (dB) when a width W2 of the portion of the insertion layer 180 disposed on the second-1 surface 162*a* is 0. In addition, attenuation performance may vary depending on the thickness T3 of the insertion layer 180, but it is confirmed that attenuation performance has a high value such as about 47.2 (dB), when the width W2 of the insertion layer 180 is about 0.5 μm to about 0.8 μm.

As illustrated in FIG. 5, as compared with a related art, it is confirmed that, regardless of the width W2 of the portion of the insertion layer 180 disposed on the second-1 surface 162*a*, attenuation performance according to the thickness T3 of the insertion layer 180 disposed on the second-1 surface 162*a* is improved.

The protective layer 190 is formed in a region except for portions of the first electrode 150 and the second electrode 170. The protective layer 190 may prevent the second electrode 170 and the first electrode 150 from being damaged during a process of a manufacturing method.

Furthermore, a portion of the protective layer 190 may be removed by etching in order to control frequency in a final process of a manufacturing method. In other words, a thickness of the protective layer 190 may be adjusted. The protective layer 190 may be formed of a dielectric layer containing any one of silicon nitride ($Si_3N_4$), silicon oxide ($SiO_2$), manganese oxide (MnO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), by way of example. Additionally, the protective layer 190 may include a hydrophobic monolayer to prevent moisture absorption of a thin film of a resonator.

The metal pad 195 is formed on a portion of the first electrode 150 and the second electrode 170, on which the protective layer 190 described above is not formed. As an example, the metal pad 195 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

As described above, as the insertion layer 180 is disposed on the extension portion E of the piezoelectric layer 160 having a step portion, attenuation performance and an effective electromechanical coupling coefficient ($Kt^2$) may be improved.

Figure 6:
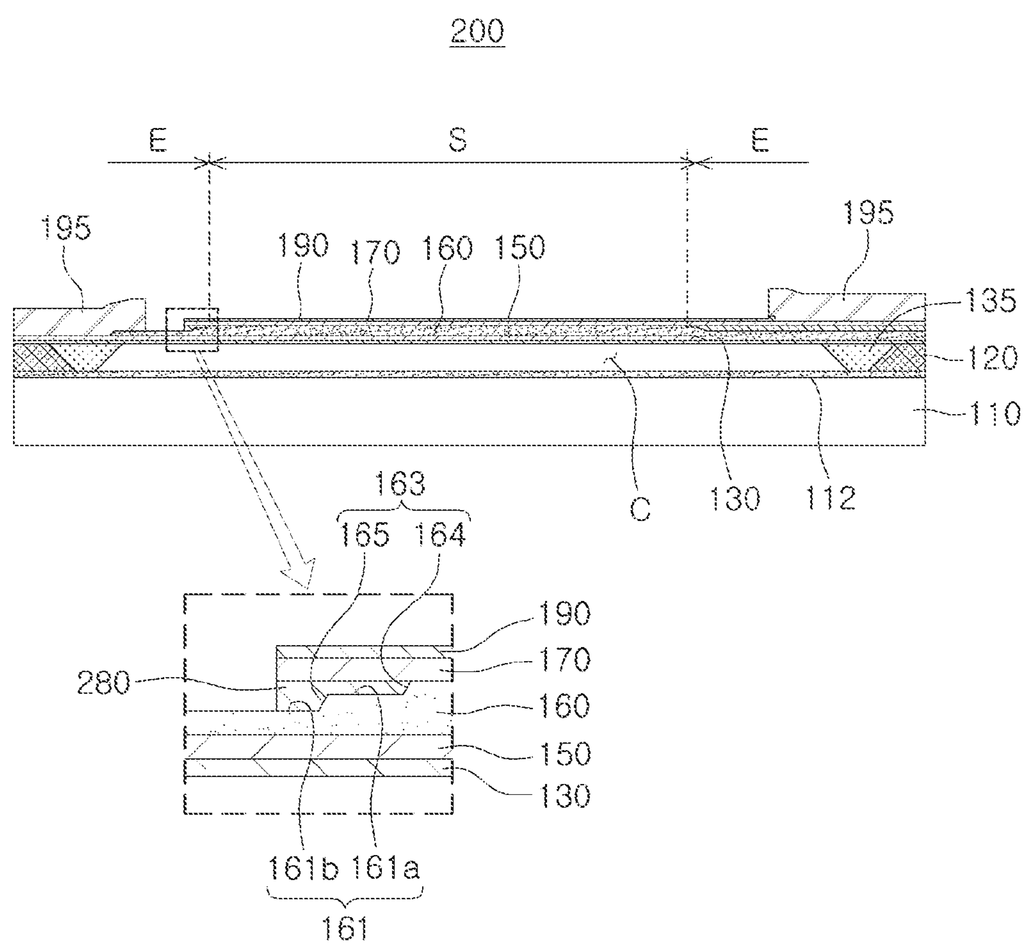
FIG. 6 is a schematic cross-sectional view illustrating a bulk-acoustic resonator, according to an embodiment.

FIG. 6 is a schematic cross-sectional view illustrating a bulk-acoustic resonator 200, according to an embodiment.

Referring to FIG. 6, the bulk-acoustic resonator 200 may include the substrate 110, the sacrificial layer 120, the membrane layer 130, the etch-stop portion 135, the first electrode 150, the piezoelectric layer 160, the second electrode 170, an insertion layer 280, the protective layer 190, and the metal pad 195, for example.

The insertion layer 280 is disposed on the extension portion E. As an example, a portion of the insertion layer 280 is disposed on a side of the first surface 161, while a remaining portion of the insertion layer 280 is disposed on a side of the second surface 162 (see FIG. 1). In more detail, a portion of the insertion layer 280 is disposed on the first-1 surface 161*a*, the second connection surface 165, and the first-2 surface 161*b*, while a remaining portion of the insertion layer 280 is disposed on a side of the second surface 162. That is, an end of a portion of the insertion layer 280 may be disposed on the first-2 surface 161*b*.

As an example, the insertion layer 280 may be formed of a dielectric material such as silicon oxide ($SiO_2$), aluminum nitride (AlN), aluminum oxide ($Al_2O_3$), silicon nitride ($Si_3N_4$), manganese oxide (MnO), zirconium oxide ($ZrO_2$), lead zirconate titanate (PZT), gallium arsenide (GaAs), oxide hafnium ($HfO_2$), aluminum oxide ($Al_2O_3$), titanium oxide ($TiO_2$), zinc oxide (ZnO), or the like, and may be formed of a material different from that of the piezoelectric layer 160. Additionally, as an example, the insertion layer 280 may be formed of a metal such as aluminum (Al), titanium (Ti), or the like, but may be formed of a material different from a material of the first electrode 150 and the second electrode 170.

Ends of portions of the second electrode 170 and the protective layer 190 are disposed to be aligned with an end of the insertion layer 280.

Figure 7:
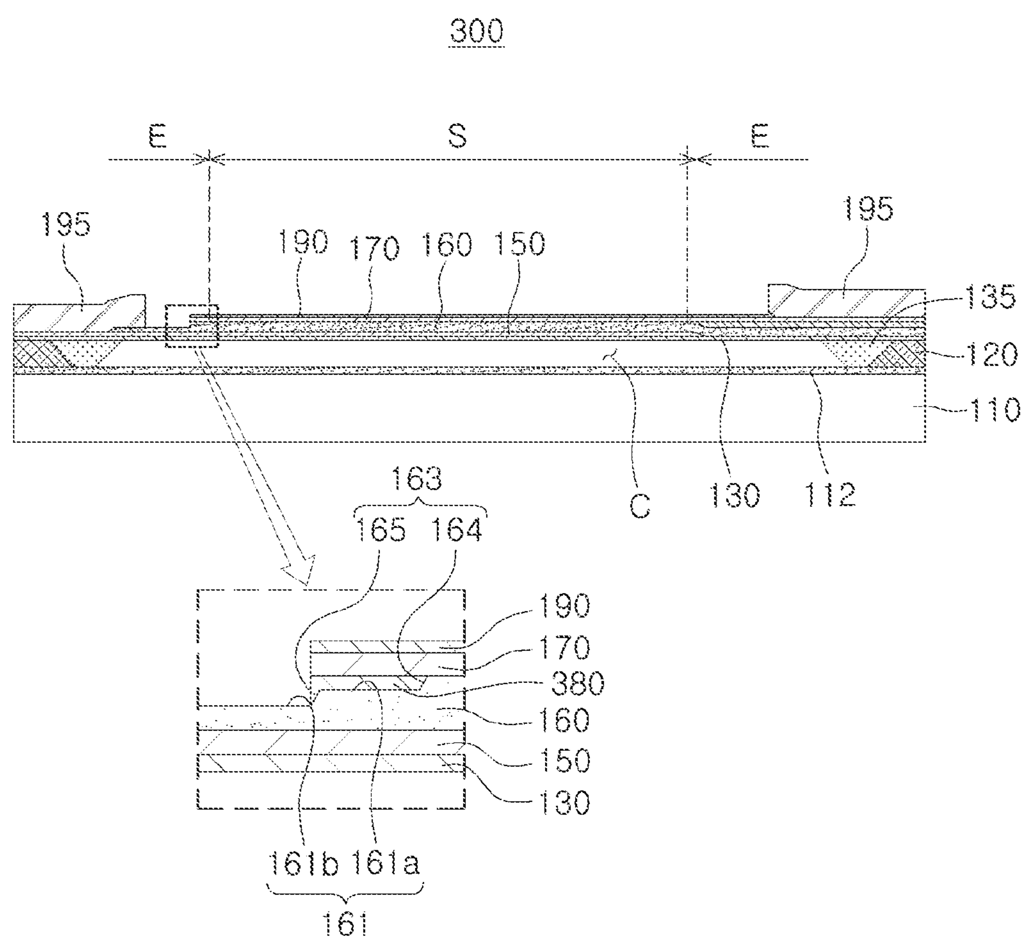
FIG. 7 is a schematic cross-sectional view illustrating a bulk-acoustic resonator, according to an embodiment.

FIG. 7 is a schematic cross-sectional view illustrating a bulk-acoustic resonator 300, according to an embodiment.

Referring to FIG. 7, the bulk-acoustic resonator 300 may include the substrate 110, the sacrificial layer 120, the membrane layer 130, the etch-stop portion 135, the first electrode 150, the piezoelectric layer 160, the second electrode 170, an insertion layer 380, the protective layer 190, and the metal pad 195, for example.

The insertion layer 380 is disposed on the extension portion E. As an example, a portion of the insertion layer 380 is disposed on a side of the first surface 161, while a remaining portion of the insertion layer 380 is disposed on a side of the second surface 162 (see FIG. 1). In more detail, a portion of the insertion layer 380 is disposed on the first-1 surface **161*a* and the second connection surface 165, while a remaining portion of the insertion layer 380 is disposed on a side of the second surface 162. That is, an end of a portion of the insertion layer 380 may be disposed on the second connection surface 165**.

As an example, the insertion layer 380 may be formed of a dielectric material such as silicon oxide ($SiO_2$), aluminum nitride (AlN), aluminum oxide ($Al_2O_3$), silicon nitride ($Si_3N_4$), manganese oxide (MnO), zirconium oxide ($ZrO_2$), lead zirconate titanate (PZT), gallium arsenide (GaAs), oxide hafnium ($HfO_2$), aluminum oxide ($Al_2O_3$), titanium oxide ($TiO_2$), zinc oxide (ZnO), or the like, and may be formed of a material different from that of the piezoelectric layer 160. Moreover, as an example, the insertion layer 380 may be formed of a metal such as aluminum (Al), titanium (Ti), or the like, but may be formed of a material different from a material of the first electrode 150 and the second electrode 170.

Ends of portions of the second electrode 170 and the protective layer 190 are disposed to be aligned with an end of the insertion layer 380.

Figure 8:
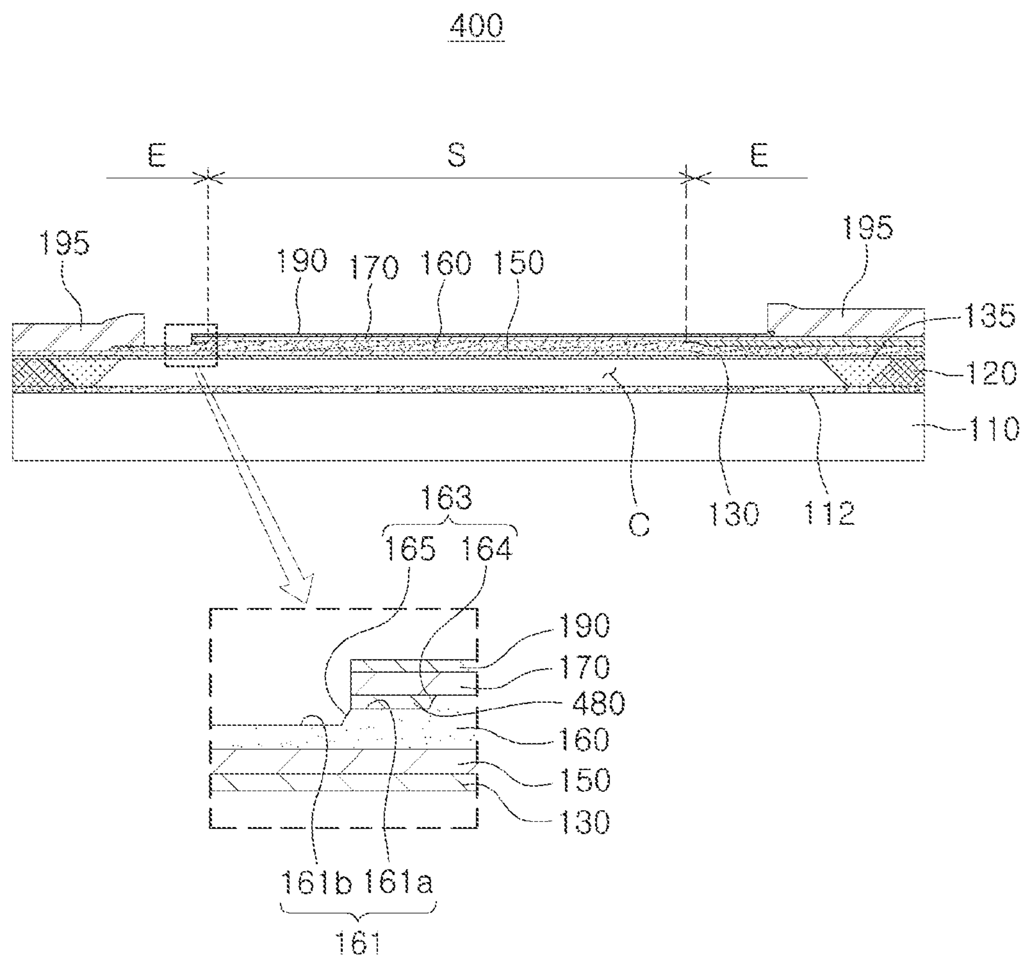
FIG. 8 is a schematic cross-sectional view illustrating a bulk-acoustic resonator, according to an embodiment.

FIG. 8 is a schematic cross-sectional view illustrating a bulk-acoustic resonator 400, according to an embodiment.

Referring to FIG. 8, the bulk-acoustic resonator 400 may include the substrate 110, the sacrificial layer 120, the membrane layer 130, the etch-stop portion 135, the first electrode 150, the piezoelectric layer 160, the second electrode 170, an insertion layer 480, the protective layer 190, and the metal pad 195, for example.

The insertion layer 480 is disposed on the extension portion E. As an example, a portion of the insertion layer 480 is disposed on a side of the first surface 161, while a remaining portion of the insertion layer 480 is disposed on a side of the second surface 162 (see FIG. 1). In more detail, a portion of the insertion layer 480 is disposed on the first-1 surface **161*a*, while a remaining portion of the insertion layer 480 is disposed on a side of the second surface 162. That is, an end of a portion of the insertion layer 480 may be disposed on an end of the first-1 surface 161*a***.

As an example, the insertion layer 480 may be formed of a dielectric material such as silicon oxide ($SiO_2$), aluminum nitride (AlN), aluminum oxide ($Al_2O_3$), silicon nitride ($Si_3N_4$), manganese oxide (MnO), zirconium oxide ($ZrO_2$), lead zirconate titanate (PZT), gallium arsenide (GaAs), oxide hafnium ($HfO_2$), aluminum oxide ($Al_2O_3$), titanium oxide ($TiO_2$), zinc oxide (ZnO), or the like, and may be formed of a material different from that of the piezoelectric layer 160. Additionally, as an example, the insertion layer 480 may be formed of a metal, such as aluminum (Al), titanium (Ti), or the like, but may be formed of a material different from a material of the first electrode 150 and the second electrode 170.

Ends of portions of the second electrode 170 and the protective layer 190 are disposed to be aligned with an end of the insertion layer 480.

Figure 9:
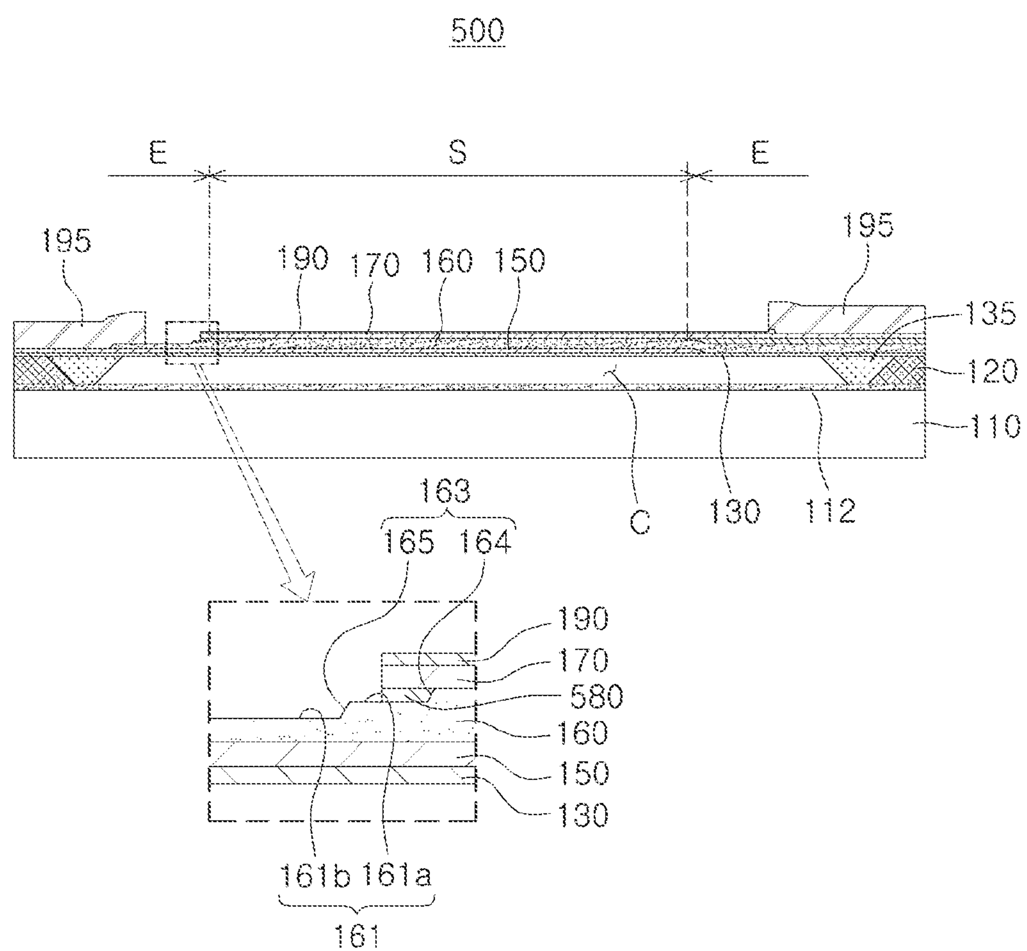
FIG. 9 is a schematic cross-sectional view illustrating a bulk-acoustic resonator according to an embodiment.

FIG. 9 is a schematic cross-sectional view illustrating a bulk-acoustic resonator 500, according to an embodiment.

Referring to FIG. 9, the bulk-acoustic resonator 500 may include the substrate 110, the sacrificial layer 120, the membrane layer 130, the etch-stop portion 135, the first electrode 150, the piezoelectric layer 160, the second electrode 170, an insertion layer 580, the protective layer 190, and the metal pad 195, for example.

The insertion layer 580 is disposed on the extension portion E. As an example, a portion of the insertion layer 580 is disposed on a side of the first surface 161, while a remaining portion of the insertion layer 580 is disposed on a side of the second surface 162 (see FIG. 1). In more detail, a portion of the insertion layer 580 is disposed on the first-1 surface **161*a*, while a remaining portion of the insertion layer 580 is disposed on a side of the second surface 162. That is, an end of a portion of the insertion layer 580 may be disposed on an upper end of the first-1 surface 161*a***.

As an example, the insertion layer 580 may be formed of a dielectric material such as silicon oxide ($SiO_2$), aluminum nitride (AlN), aluminum oxide ($Al_2O_3$), silicon nitride ($Si_3N_4$), manganese oxide (MnO), zirconium oxide ($ZrO_2$), lead zirconate titanate (PZT), gallium arsenide (GaAs), oxide hafnium ($HfO_2$), aluminum oxide ($Al_2O_3$), titanium oxide ($TiO_2$), zinc oxide (ZnO), or the like, and may be formed of a material different from that of the piezoelectric layer 160. Additionally, as an example, the insertion layer 580 may be formed of a metal, such as aluminum (Al), titanium (Ti), or the like, but may be formed of a material different from a material of the first electrode 150 and the second electrode 170.

Ends of portions of the second electrode 170 and the protective layer 190 are disposed to be aligned with an end of the insertion layer 580.

Figure 10:
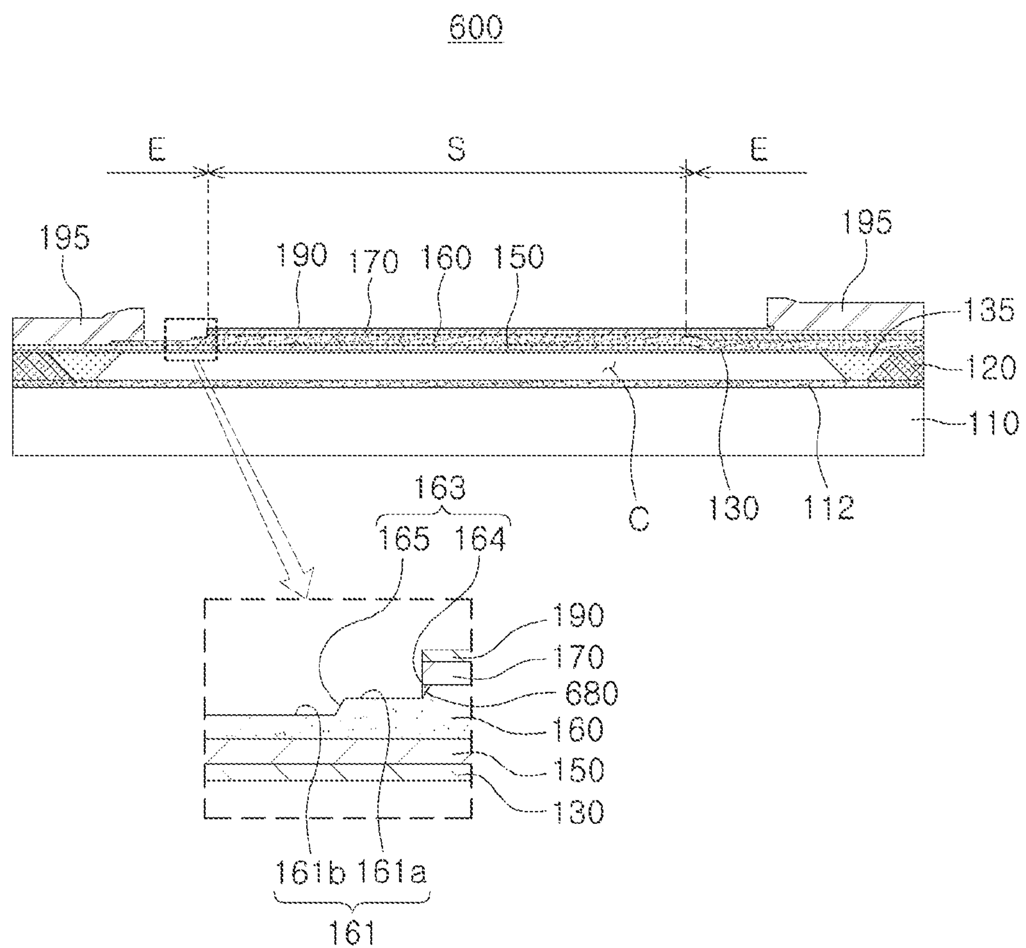
FIG. 10 is a schematic cross-sectional view illustrating a bulk-acoustic resonator, according to a sixth embodiment.

FIG. 10 is a schematic cross-sectional view illustrating a bulk-acoustic resonator 600, according to an embodiment.

Referring to FIG. 10, the bulk-acoustic resonator 600 may include the substrate 110, the sacrificial layer 120, the membrane layer 130, the etch-stop portion 135, the first electrode 150, the piezoelectric layer 160, the second electrode 170, an insertion layer 680, the protective layer 190, and the metal pad 195, for example.

The insertion layer 680 is disposed on the extension portion E. As an example, a portion of the insertion layer 680 is disposed on the first connection surface 164, while a remaining portion of the insertion layer 680 is disposed on the second surface 162 (see FIG. 1). In more detail, a portion of the insertion layer 680 is disposed on the first connection surface 164, while a remaining portion of the insertion layer 680 is disposed on a side of the second surface 162. That is, an end of a portion of the insertion layer 680 may be disposed on an end of the first connection surface 164.

As an example, the insertion layer 680 may be formed of a dielectric material such as silicon oxide ($SiO_2$), aluminum nitride (AlN), aluminum oxide ($Al_2O_3$), silicon nitride ($Si_3N_4$), manganese oxide (MnO), zirconium oxide ($ZrO_2$), lead zirconate titanate (PZT), gallium arsenide (GaAs), oxide hafnium ($HfO_2$), aluminum oxide ($Al_2O_3$), titanium oxide ($TiO_2$), zinc oxide (ZnO), or the like, and may be formed of a material different from that of the piezoelectric layer 160. Additionally, as an example, the insertion layer 680 may be formed of a metal, such as aluminum (Al), titanium (Ti), or the like, but may be formed of a material different from a material of the first electrode 150 and the second electrode 170.

Ends of portions of the second electrode 170 and the protective layer 190 are disposed to be aligned with an end of the insertion layer 680.

Figure 11:
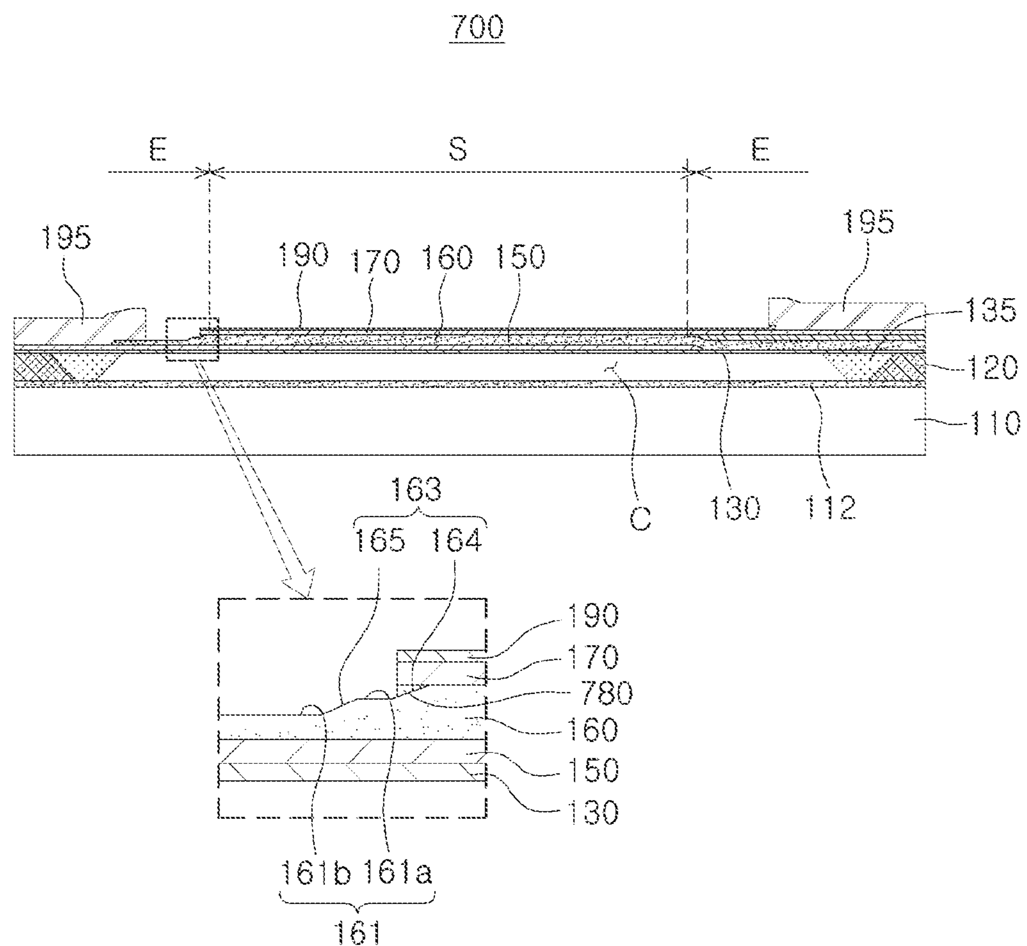
FIG. 11 is a schematic cross-sectional view illustrating a bulk-acoustic resonator according an embodiment.

FIG. 11 is a schematic cross-sectional view illustrating a bulk-acoustic resonator 700, according to an embodiment.

Referring to FIG. 11, the bulk-acoustic resonator 700 may include the substrate 110, the sacrificial layer 120, the membrane layer 130, the etch-stop portion 135, the first electrode 150, the piezoelectric layer 160, the second electrode 170, an insertion layer 780, the protective layer 190, and the metal pad 195, for example.

The insertion layer 780 is disposed on the extension portion E. As an example, a portion of the insertion layer 780 is disposed on the first connection surface 164, while a remaining portion of the insertion layer 780 is disposed on a second surface 162 (see FIG. 1). In more detail, a portion of the insertion layer 780 is disposed on the first connection surface 164, while a remaining portion of the insertion layer 780 is disposed on the second surface 162. That is, an end of a portion of the insertion layer 780 may be disposed on an upper end of the first connection surface 164.

As an example, the insertion layer 780 may be formed of a dielectric material such as silicon oxide ($SiO_2$), aluminum nitride (AlN), aluminum oxide ($Al_2O_3$), silicon nitride ($Si_3N_4$), manganese oxide (MnO), zirconium oxide ($ZrO_2$), lead zirconate titanate (PZT), gallium arsenide (GaAs), oxide hafnium ($HfO_2$), aluminum oxide ($Al_2O_3$), titanium oxide ($TiO_2$), zinc oxide (ZnO), or the like, and may be formed of a material different from that of the piezoelectric layer 160. Additionally, as an example, the insertion layer 780 may be formed of a metal, such as aluminum (Al), titanium (Ti), or the like, but may be formed of a material different from a material of the first electrode 150 and the second electrode 170.

Ends of portions of the second electrode 170 and the protective layer 190 are disposed to be aligned with an end of the insertion layer 780.

Figure 12:
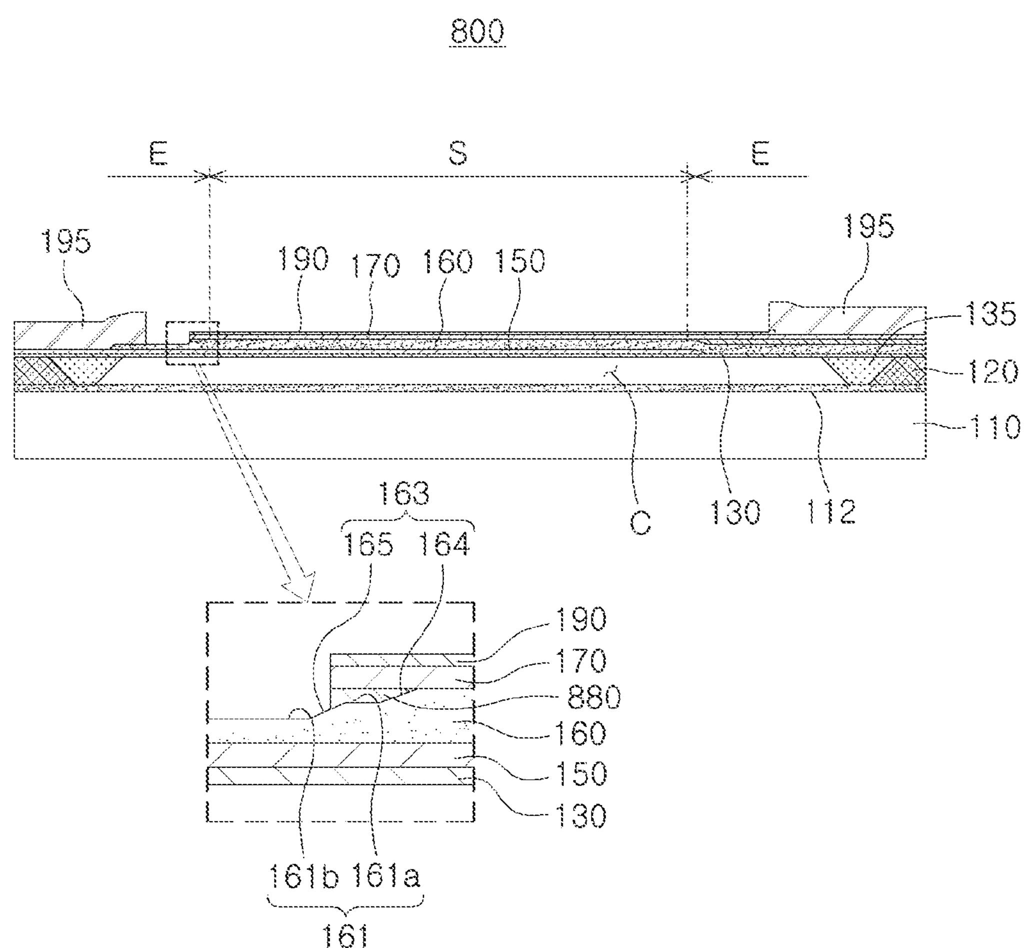
FIG. 12 is a schematic cross-sectional view illustrating a bulk-acoustic resonator, according to an eighth embodiment.

FIG. 12 is a schematic cross-sectional view illustrating a bulk-acoustic resonator 800, according to an embodiment.

Referring to FIG. 12, the bulk-acoustic resonator 800 may include the substrate 110, the sacrificial layer 120, the membrane layer 130, the etch-stop portion 135, the first electrode 150, the piezoelectric layer 160, the second electrode 170, an insertion layer 880, the protective layer 190, and the metal pad 195, by way of example.

The insertion layer 880 is disposed on the extension portion E. As an example, a portion of the insertion layer 880 is disposed on a side of the first surface 161, while a remaining portion of the insertion layer 880 is disposed on a side of the second surface 162 (see FIG. 1). In more detail, a portion of the insertion layer 880 is disposed on the first connection surface 164, the first-1 surface 161*a*, and the second connection surface 165, while a remaining portion of the insertion layer 880 is disposed on a side of the second surface 162. That is, an end of a portion of the insertion layer 880 may be disposed on an upper end of the second connection surface 165.

As an example, the insertion layer 880 may be formed of a dielectric material such as silicon oxide ($SiO_2$), aluminum nitride (AlN), aluminum oxide ($Al_2O_3$), silicon nitride ($Si_3N_4$), manganese oxide (MnO), zirconium oxide ($ZrO_2$), lead zirconate titanate (PZT), gallium arsenide (GaAs), oxide hafnium ($HfO_2$), aluminum oxide ($Al_2O_3$), titanium oxide ($TiO_2$), zinc oxide (ZnO), or the like, and may be formed of a material different from that of the piezoelectric layer 160. Additionally, as an example, the insertion layer 880 may be formed of a metal, such as aluminum (Al), titanium (Ti), or the like, but may be formed of a material different from a material of the first electrode 150 and the second electrode 170.

Ends of portions of the second electrode 170 and the protective layer 190 are disposed to be aligned with an end of the insertion layer 880.

Figure 13:
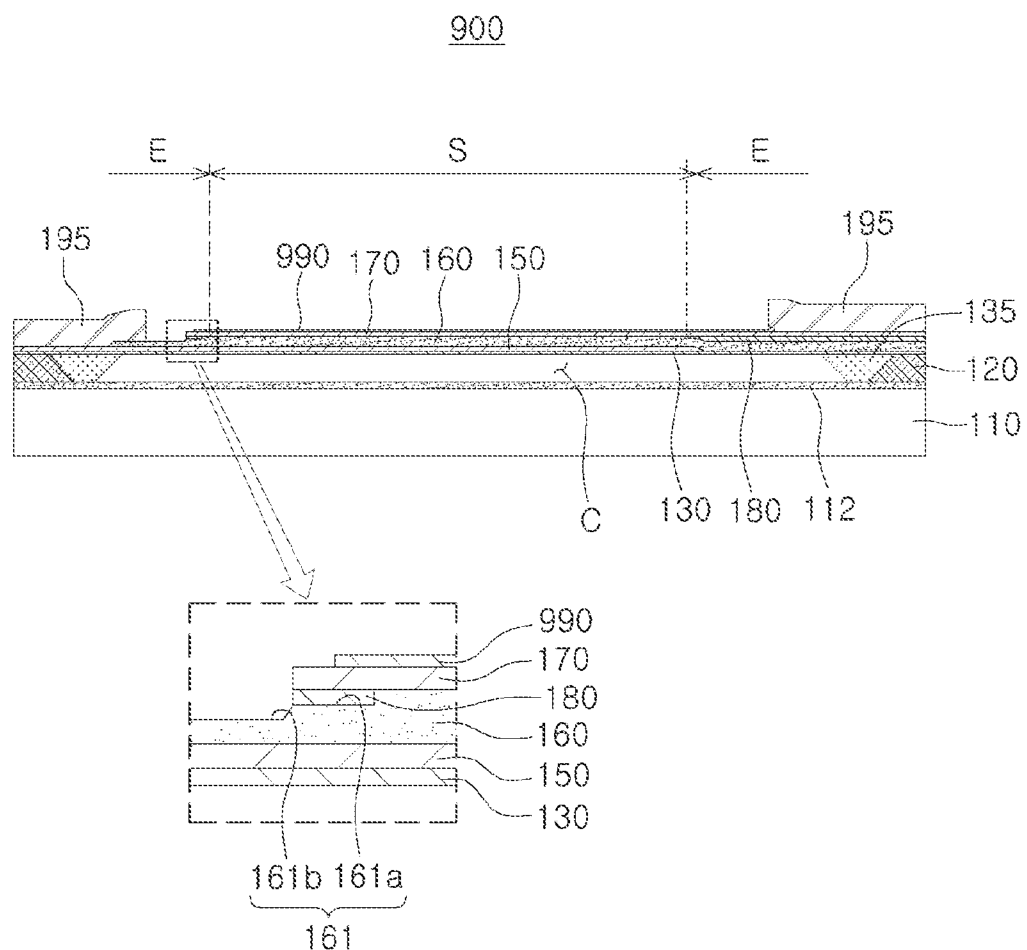
FIG. 13 is a schematic cross-sectional view illustrating a bulk-acoustic resonator according to an embodiment.

FIG. 13 is a schematic cross-sectional view illustrating a bulk-acoustic resonator 900, according to an embodiment.

Referring to FIG. 13, the bulk-acoustic resonator 900 may include the substrate 110, the sacrificial layer 120, the membrane layer 130, the etch-stop portion 135, the first electrode 150, the piezoelectric layer 160, the second electrode 170, the insertion layer 180, a protective layer 990, and the metal pad 195, for example.

The protective layer 990 is formed in a region except for portions of the first electrode 150 and the second electrode 170. The protective layer 990 may prevent the second electrode 170 and the first electrode 150 from being damaged during a manufacturing process.

Furthermore, a portion of the protective layer 990 may be removed by etching in order to control frequency in a final process of a manufacturing process. In other words, a thickness of the protective layer 990 may be adjusted. The protective layer 190 may be formed of a dielectric layer containing any one material among silicon nitride ($Si_3N_4$), silicon oxide ($SiO_2$), manganese oxide (MnO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), for example. Additionally, the protective layer 990 may include a hydrophobic monolayer to prevent moisture absorption of a thin film of a resonator.

An end of one side of the protective layer 990 may be formed to expose an end of one side of the second electrode 170. That is, an end of one side of the protective layer 990 and an end of one side of the second electrode 170 are not aligned, and the end of the one side of the protective layer 990 may be disposed to be spaced apart from the end of the one side of the second electrode 170, toward a side of a central portion.

Figure 14:
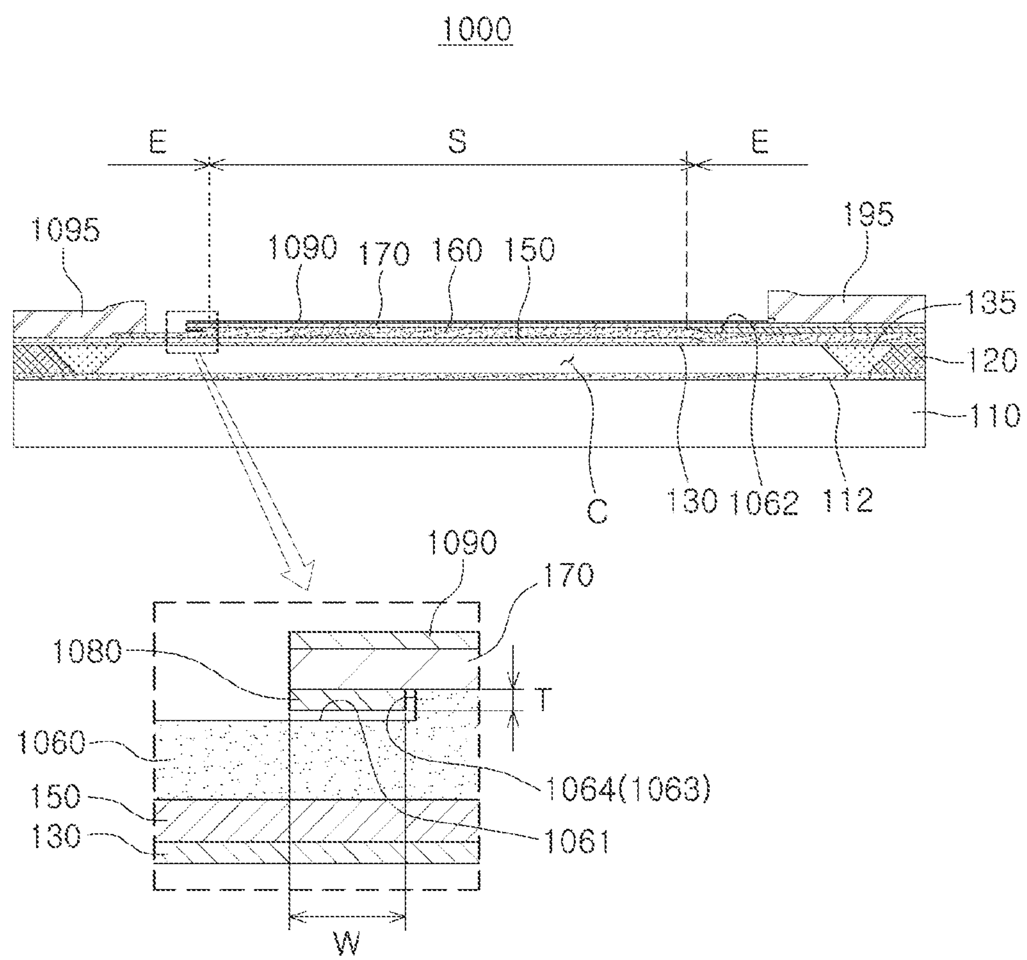
FIG. 14 is a schematic cross-sectional view illustrating a bulk-acoustic resonator, according to an embodiment.

FIG. 14 is a schematic cross-sectional view illustrating a bulk-acoustic resonator 1000, according to an embodiment.

Referring to FIG. 14, the bulk-acoustic resonator 1000 may include the substrate 110, the sacrificial layer 120, the membrane layer 130, the etch-stop portion 135, the first electrode 150, a piezoelectric layer 1060, the second electrode 170, an insertion layer 1080, the protective layer 190, and the metal pad 195, for example.

The piezoelectric layer 1060 is disposed to cover at least a portion of the first electrode 150. The piezoelectric layer 1060 has a flat portion S disposed in a central portion, and an extension portion E disposed outside the flat portion S and having at least one step portion.

The extension portion E may have a first surface 1061 disposed below an upper surface of the flat portion S, a second surface 1062, and a connection surface 1063 connecting an upper surface of the flat portion S to the first surface 1061 or the second surface 1062, or connecting the second surfaces 1062 to each other.

Additionally, the first surface 1061 is disposed on a side of an end of one side of the second electrode 170 and may have a step portion with an upper surface of the flat portion S.

In addition, the second surface 1062 has a configuration that is the same as the second surface 162 illustrated in FIG. 1. Accordingly, illustration in the drawings and detailed description thereof will be omitted.

The connection surface 1063 may have a first connection surface 1064 connecting an upper surface of the flat portion S to the first surface 1061.

The insertion layer 1080 is disposed on the extension portion E. As an example, a portion of the insertion layer 1080 is disposed on a side of the first surface 1061, while a remaining portion of the insertion layer 1080 is disposed on a side of the second surface (not shown).

As an example, a side surface and a lower surface of a portion of the insertion layer 1080, disposed at an end of the first electrode 170, may be disposed to be spaced apart from the piezoelectric layer 1060. That is, the side surface of a portion of the insertion layer 1080 may be disposed to be spaced apart from the first connection surface 1064, while the lower surface of a portion of the insertion layer 1080 may be disposed to be spaced apart from the first surface 1061.

In addition, a portion of the insertion layer 1080 and the piezoelectric layer 1060 are disposed to be spaced apart from each other to form an empty space, and the empty space may be an air layer or may be a vacuum.

Figure 15:
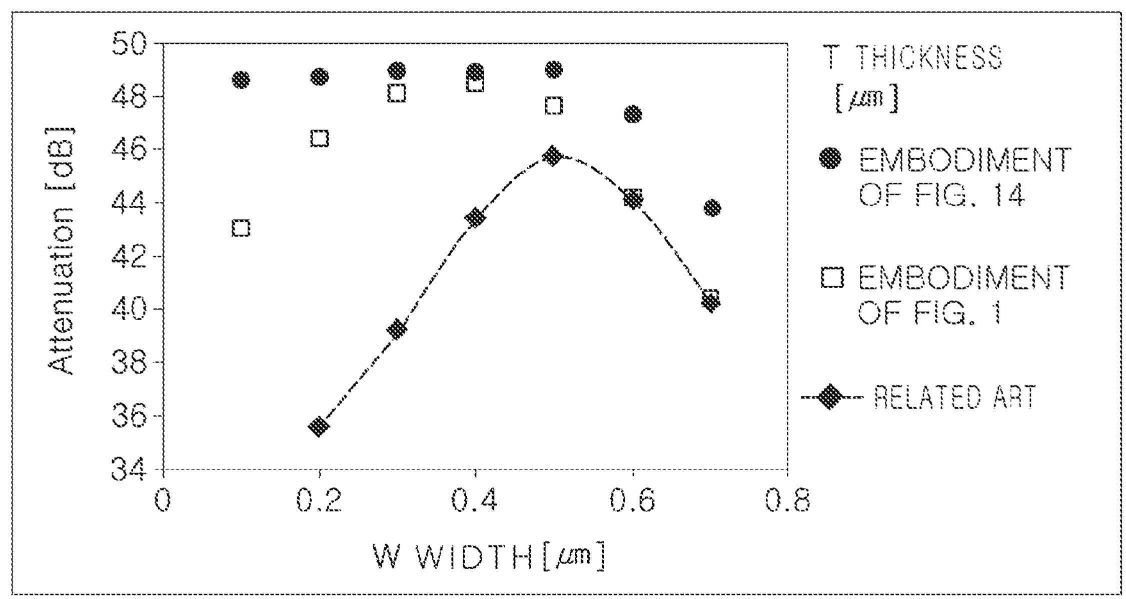
FIG. 15 is a graph illustrating attenuation performance of the bulk-acoustic resonator of FIG. 14, according to a change in a width W of a portion of an insertion layer when a portion of the insertion layer is disposed to be spaced apart from a piezoelectric layer.

FIG. 15 is a graph illustrating attenuation performance according to a change in a width W of a portion of the insertion layer 1080 of FIG. 14 when a portion of the insertion layer 1080 is disposed to be spaced apart from the piezoelectric layer 1060. In this example, a thickness T of a portion of the insertion layer 1080 is maintained to be constant, such as 0.3 μm.

In detail, in an embodiment, it is confirmed that, when a width W of a portion of the insertion layer 1080 is increased, in a range of 0.1 μm to 0.5 μm, attenuation performance is maintained to be a high value such as about 48.6 (dB) to 49.0 (dB). Thus, when a degradation tolerance is set to 1 dB from a maximum value of attenuation performance, a width W of a portion of the insertion layer 1080 may have a range of 0.1 μm to 0.5 μm, in an embodiment.

Still referring to FIG. 15, in the embodiment of FIG. 1, when a degradation tolerance is set to 1 dB from a maximum value of attenuation performance, a width W of a portion of the insertion layer 180 may have a range of 0.3 μm to 0.5 μm. Thus, in the embodiment of FIG. 14, as compared with the embodiment of FIG. 1, attenuation performance having a high value may be maintained, even when a width W of the insertion layer 1080 varies by a manufacturing process. That is, it is significantly difficult to implement a pattern of a sub-micrometer in a micro-electromechanical system (MEMS). In this regard, when an error of +/−0.1 μm is unacceptable, a yield may be significantly reduced due to a process error. However, in the embodiment of FIG. 14, even when process variation of a width of an insertion layer is large, attenuation performance having a high value can be maintained. Thus, manufacturing is more easily performed, and thus a yield is also stably maintained.

Also, as illustrated in FIG. 15, in an embodiment, it is confirmed that attenuation performance is improved as compared with a related art regardless of thickness T of a portion of the insertion layer 1080 and width W of a portion of the insertion layer 1080.

Figure 16:
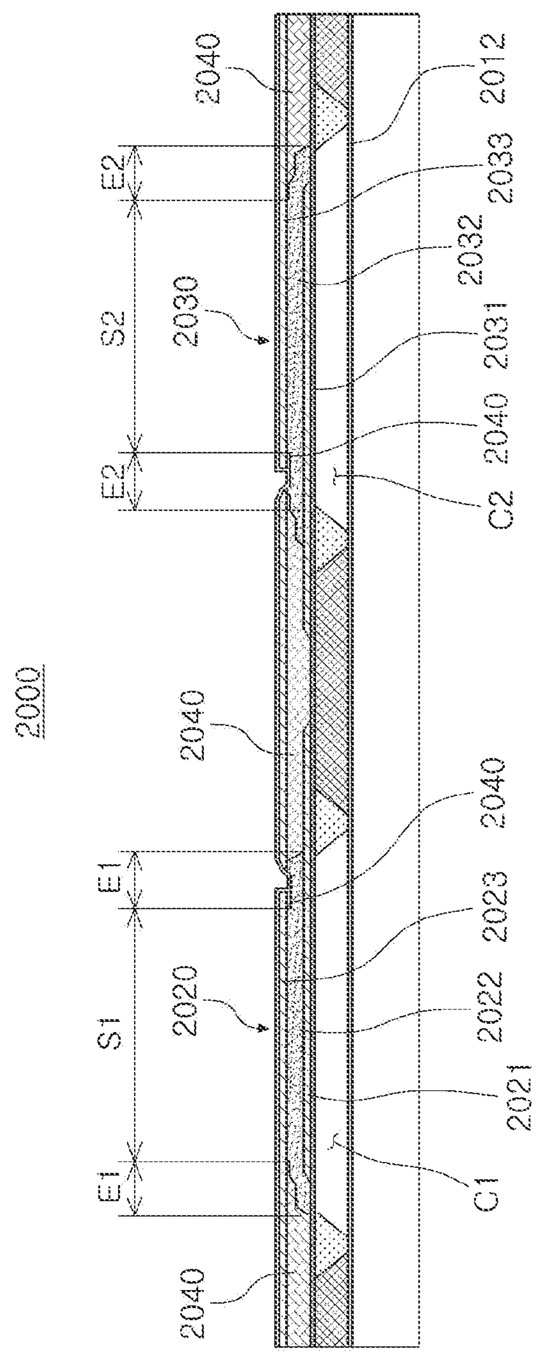
FIG. 16 is a schematic cross-sectional view illustrating an elastic wave filter device, according to an embodiment.

FIG. 16 is a schematic cross-sectional view illustrating an elastic wave filter device 2000, according to an embodiment.

Referring to FIG. 16, the elastic wave filter device 2000 may include a substrate 2010, a first resonator 2020, a second resonator 2030, and an insertion layer 2040.

The substrate 2010 may be a silicon substrate. For example, a silicon wafer or a silicon-on-insulator (SOI) substrate may be used as the substrate 2010.

An insulating layer 2012 is disposed on an upper surface of the substrate 2010, and may prevent the substrate 2010 from being etched by an etching gas when first and second cavities C1 and C2 are formed during a method of manufacturing the first and second resonators 2020 and 2030.

In this example, the insulating layer 2012 may be formed of any one or any combination of any two or more of silicon dioxide ($SiO_2$), silicon nitride ($Si_3N_4$), aluminum oxide ($Al_2O_3$), and aluminum nitride (AlN), and may be formed on the substrate 2010 through a process such as chemical vapor deposition, RF magnetron sputtering, or evaporation.

The first resonator 2020 may have a first-1 electrode 2021 disposed on an upper portion of the substrate 2010, and a first piezoelectric layer 2022 disposed to at least partially cover the first-1 electrode 2021, and having a first flat portion S1 disposed in a central portion, and a first extension portion E1 disposed outside the first flat portion S1 and having at least one step portion. The first resonator 2020 may further include a second-1 electrode 2023 disposed on an upper portion of the first piezoelectric layer 2022.

A first cavity C1 is formed in a lower portion of the first resonator 2020.

The second resonator 2030 may have a first-2 electrode 2031 disposed on an upper portion of the substrate 2010, and a second piezoelectric layer 2022 disposed to at least partially cover the first-2 electrode 2031, and having a second flat portion S2 disposed in a central portion, and a second extension portion E2 disposed outside the second flat portion S2 and having at least one step portion, and. The second resonator 2030 may further include a second-2 electrode 2033 disposed on an upper portion of the second piezoelectric layer 2032.

A second cavity C2 is formed in a lower portion of the second resonator 2030.

The insertion layer 2040 may be disposed in upper portions of the first and second extension portions E1 and E2, and on the first piezoelectric layer 2022 and the second piezoelectric layer 2032, and may be formed of a conductive material. A portion of the insertion layer 2040 disposed between the first piezoelectric layer 2022 and the second piezoelectric layer 2032, may electrically connect the first-1 electrode 2021 to the first-2 electrode 2031.

Figure 17:
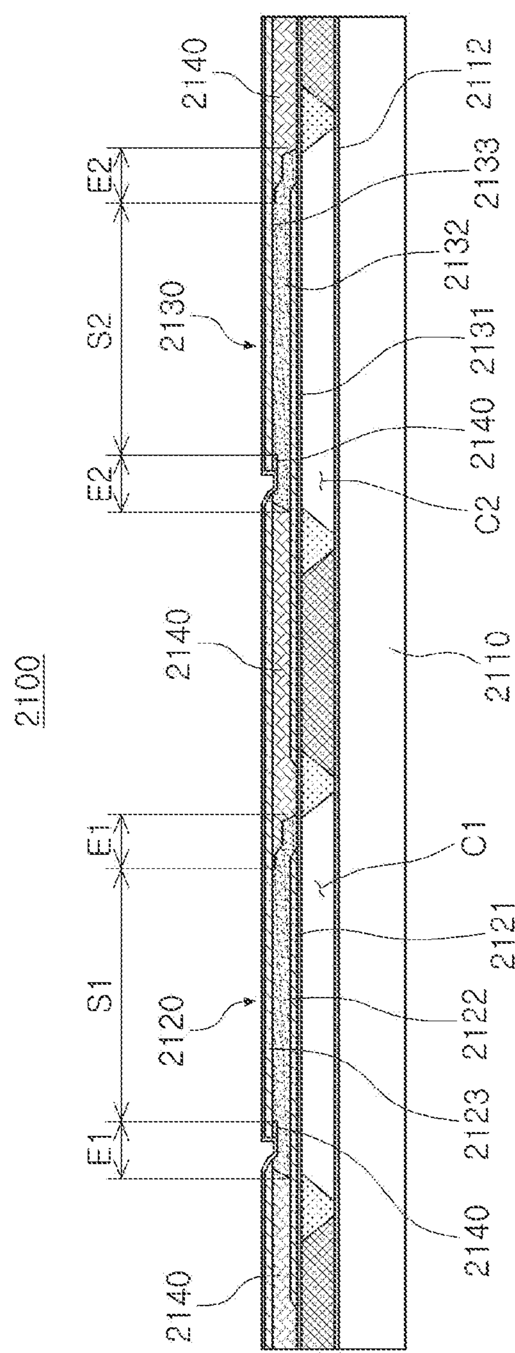
FIG. 17 is a schematic cross-sectional view illustrating an elastic wave filter device, according to an embodiment.

FIG. 17 is a schematic cross-sectional view illustrating an elastic wave filter device 2100, according to an embodiment.

Referring to FIG. 17, the elastic wave filter device 2100 may include a substrate 2110, a first resonator 2120, a second resonator 2130, and an insertion layer 2140.

The substrate 2110 may be a silicon substrate. For example, a silicon wafer or a silicon-on-insulator (SOI) substrate may be used as the substrate 2110.

An insulating layer 2112 is disposed on an upper surface of the substrate 2110, and may prevent the substrate 2110 from being etched by an etching gas when first and second cavities C1 and C2 are formed during a method of manufacturing the first and second resonators 2120 and 2130.

In this example, the insulating layer 2112 may be formed of any one or any combination of any two or more of silicon dioxide ($SiO_2$), silicon nitride ($Si_3N_4$), aluminum oxide ($Al_2O_3$), and aluminum nitride (AlN), and may be formed on the substrate 2110 through a process such as chemical vapor deposition, RF magnetron sputtering, or evaporation.

The first resonator 2120 may have a first-1 electrode 2121 disposed on an upper portion of the substrate 2110, and a first piezoelectric layer 2122 disposed to at least partially cover the first-1 electrode 2121, and having a first flat portion S1 disposed in a central portion, and a first extension portion E1 disposed outside the first flat portion S1 and having at least one step portion. The first resonator 2120 may further include a second-1 electrode 2123 disposed on an upper portion of the first piezoelectric layer 2122.

A first cavity C1 is formed in a lower portion of the first resonator 2120.

The second resonator 2130 may have a first-2 electrode 2131 disposed on an upper portion of the substrate 2110, and a second piezoelectric layer 2132 disposed to at least partially cover the first-2 electrode 2131, and having a second flat portion S2 disposed in a central portion, and a second extension portion E2 disposed outside the second flat portion S2 and having at least one step portion. The second resonator 2130 may further include second-2 electrode 2133 disposed on an upper portion of the second piezoelectric layer 2132.

A second cavity C2 is formed in a lower portion of the second resonator 2130.

The insertion layer 2140 may be disposed in upper portions of the first and second extension portions E1 and E2, and on the first piezoelectric layer 2122 and the second piezoelectric layer 2132, and may be formed of a conductive material. A portion of the insertion layer 2140 disposed between the first piezoelectric layer 2122 and the second piezoelectric layer 2132 may electrically connect the second-1 electrode 2123 to the first-2 electrode 2131.

Figure 18:
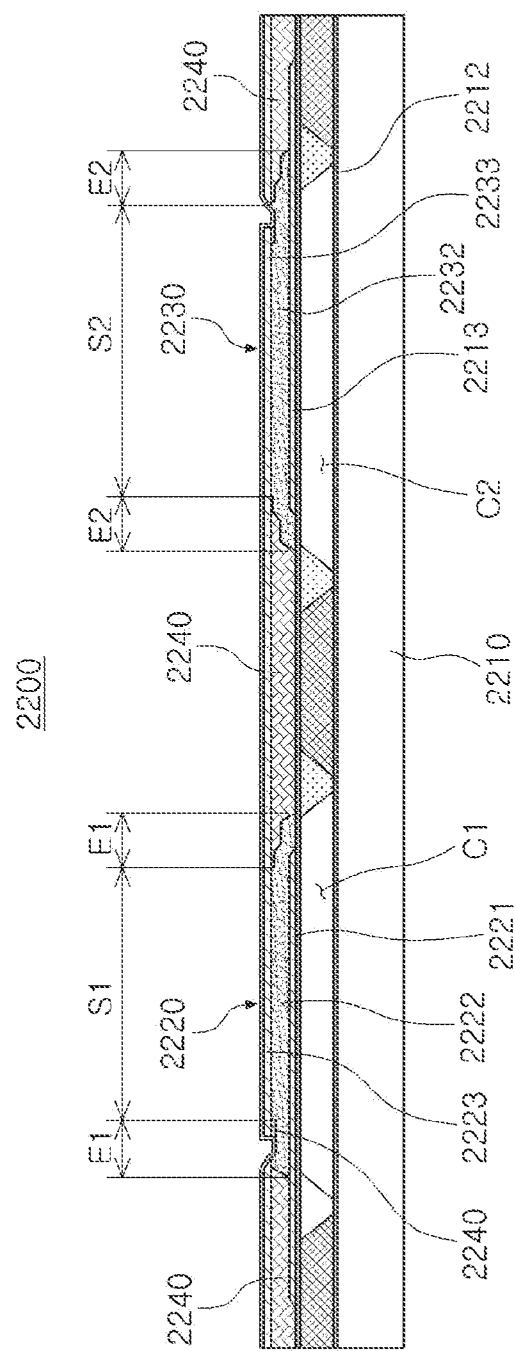
FIG. 18 is a schematic cross-sectional view illustrating an elastic wave filter device, according to an embodiment.

FIG. 18 is a schematic cross-sectional view illustrating an elastic wave filter device 2200, according to an embodiment.

Referring to FIG. 18, the elastic wave filter device 2200 may include a substrate 2210, a first resonator 2220, a second resonator 2230, and an insertion layer 2240.

The substrate 2210 may be a silicon substrate. For example, a silicon wafer or a silicon-on-insulator (SOI) substrate may be used as the substrate 2210.

An insulating layer 2212 is disposed on an upper surface of the substrate 2210, and may prevent the substrate 2210 from being etched by an etching gas when first and second cavities C1 and C2 are formed during a method of manufacturing the first and second resonators 2220 and 2230.

In this example, the insulating layer 2212 may be formed of any one or any combination of any two or more of silicon dioxide ($SiO_2$), silicon nitride ($Si_3N_4$), aluminum oxide ($Al_2O_3$), and aluminum nitride (AlN), and may be formed on the substrate 2210 through a process such as chemical vapor deposition, RF magnetron sputtering, or evaporation.

The first resonator 2220 may have a first-1 electrode 2221 disposed on an upper portion of the substrate 2210, and a first piezoelectric layer 2222 disposed to at least partially cover the first-1 electrode 2221, and having a first flat portion S1 disposed in a central portion, and a first extension portion E1 disposed outside the first flat portion S1 and having at least one step portion. The first resonator 2220 may further include a second-1 electrode 2223 disposed on an upper portion of the first piezoelectric layer 2222.

A first cavity C1 is formed in a lower portion of the first resonator 2220.

The second resonator 2230 may have a first-2 electrode 2231 disposed on an upper portion of the substrate 2210, and a second piezoelectric layer 2232 disposed to at least partially cover the first-2 electrode 2231, and having a second flat portion S2 disposed in a central portion, and a second extension portion E2 disposed outside the second flat portion S2 and having at least one step portion. The second resonator 2230 may further include a second-2 electrode 2233 disposed on an upper portion of the second piezoelectric layer 2232.

A second cavity C2 is formed in a lower portion of the second resonator 2230.

The insertion layer 2240 may be disposed in upper portions of the first and second extension portions E1 and E2, and on the first piezoelectric layer 2222 and the second piezoelectric layer 2232, and may be formed of a conductive material. A portion of the insertion layer 2240 disposed between the first piezoelectric layer 2222 and the second piezoelectric layer 2232 may reduce electrical resistance, while being connected to the second-1 electrode 2223 and the second-2 electrode 2233.

Figure 19:
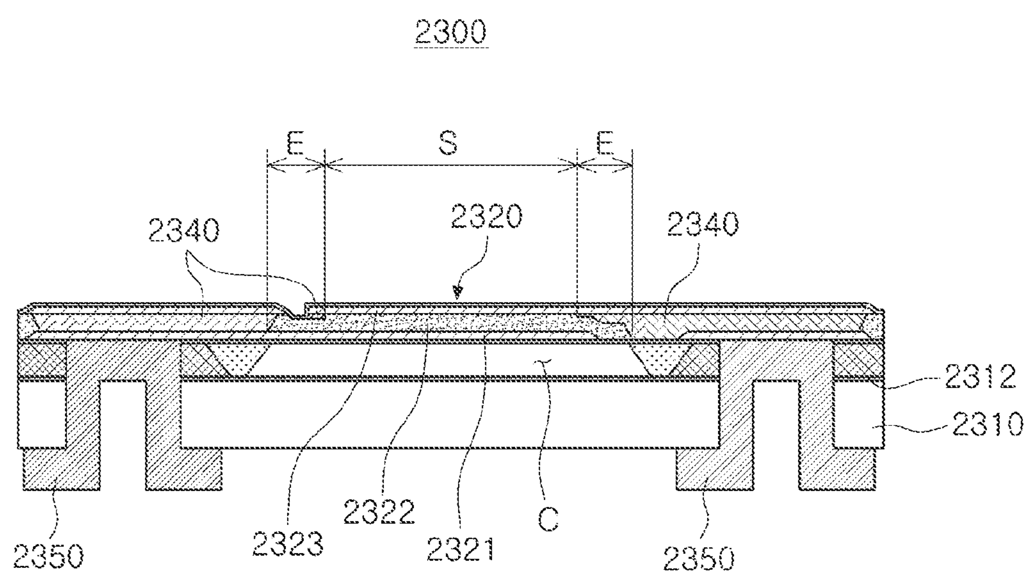
FIG. 19 is a schematic cross-sectional view illustrating an elastic wave filter device, according to an embodiment.

FIG. 19 is a schematic cross-sectional view illustrating an elastic wave filter device 2300, according to an embodiment.

Referring to FIG. 19, the elastic wave filter device 2300 may include a substrate 2310, a resonator 2320, and an insertion layer 2340.

The substrate 2310 may be a silicon substrate. For example, a silicon wafer or a silicon-on-insulator (SOI) substrate may be used as the substrate 2310.

An insulating layer 2312 is disposed on an upper surface of the substrate 2310, and may prevent the substrate 2310 from being etched by an etching gas when a cavity C is formed during a method of manufacturing the resonator 2320.

In this example, the insulating layer 2312 may be formed of any one or any combination of any two or more of silicon dioxide ($SiO_2$), silicon nitride ($Si_3N_4$), aluminum oxide ($Al_2O_3$), and aluminum nitride (AlN), and may be formed on the substrate 2310 through a process such as chemical vapor deposition, RF magnetron sputtering, or evaporation.

The resonator 2320 may have a first electrode 2321 disposed on an upper portion of the substrate 2310, and a piezoelectric layer 2322 disposed to at least partially cover the first electrode 2321, and having a flat portion S disposed in a central portion, and an extension portion E disposed outside the flat portion S and having at least one step portion. The resonator may further include a second electrode 2323 disposed on an upper portion of the piezoelectric layer 2322.

The cavity C is formed in a lower portion of the resonator 2320.

The insertion layer 2340 is disposed in an upper portion of the extension portion E and between/adjacent to the piezoelectric layers 2322, and may be formed of a conductive material. A portion of the insertion layer 2340 disposed between/adjacent to the piezoelectric layers 2322 may be electrically connected to an external wiring 2350.

Figure 20:
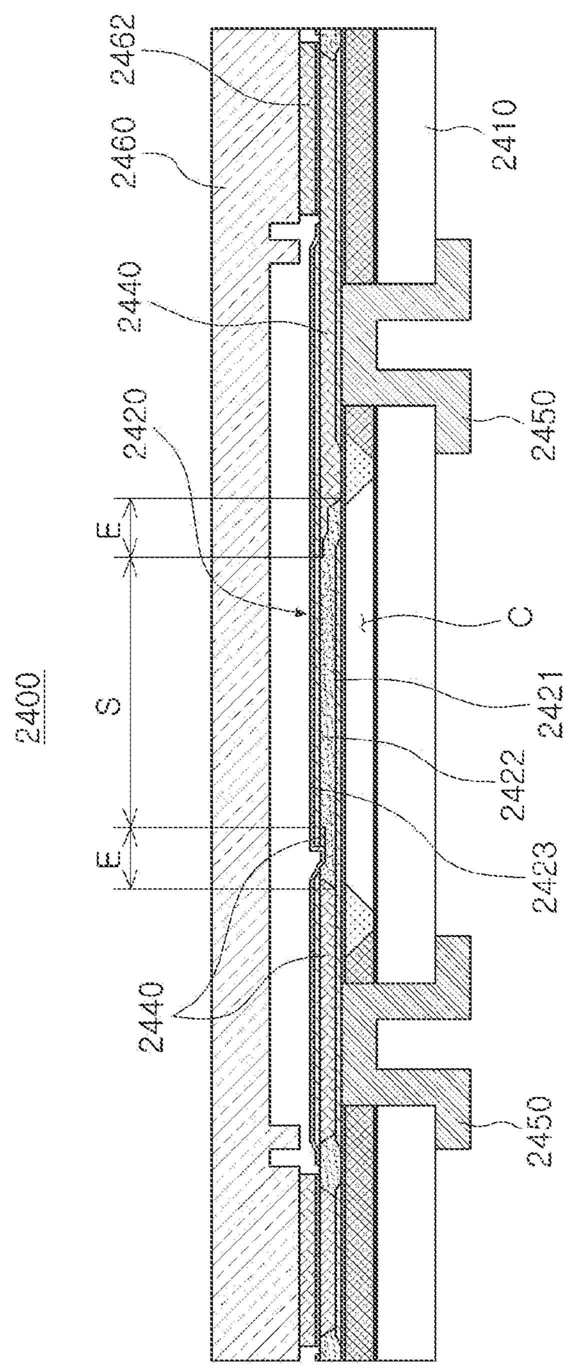
FIG. 20 is a schematic cross-sectional view illustrating an elastic wave filter device, according to an embodiment.

FIG. 20 is a schematic cross-sectional view illustrating an elastic wave filter device 2400, according to an embodiment.

Referring to FIG. 20, the elastic wave filter device 2400 may include a substrate 2410, a resonator 2420, an insertion layer 2440, an external wiring 2450, and a cap 2460.

The substrate 2410 may be a silicon substrate. For example, a silicon wafer or a silicon-on-insulator (SOI) substrate may be used as the substrate 2410.

An insulating layer 2412 is disposed on an upper surface of the substrate 2410, and may prevent the substrate 2410 from being etched by an etching gas, when a cavity C is formed during a method of manufacturing the resonator 2420.

In this example, the insulating layer 2412 may be formed of any one or any combination of any two or more of silicon dioxide ($SiO_2$), silicon nitride ($Si_3N_4$), aluminum oxide ($Al_2O_3$), and aluminum nitride (AlN), and may be formed on the substrate 2410 through a process such as chemical vapor deposition, RF magnetron sputtering, or evaporation.

The resonator 2420 may have a first electrode 2421 disposed on an upper portion of the substrate 2410, and a piezoelectric layer 2422 disposed to at least partially cover the first electrode 2421, and having a flat portion S disposed in a central portion, and an extension portion E disposed outside the flat portion S and having at least one step portion. The resonator 2420 may further include a second electrode 2423 disposed on an upper portion of the piezoelectric layer 2422.

The cavity C is formed in a lower portion of the resonator 2420.

The insertion layer 2440 is disposed in an upper portion of the extension portion E and between/adjacent to the piezoelectric layers 2422, and may be formed of a conductive material. A portion of the insertion layer 2440 disposed between the piezoelectric layers 2422 may be electrically connected to a sealing line 2462 of a cap 2460 and an external wiring 2450.

The cap 2460 is bonded to the insertion layer 2440 and may form a space in a gap with the resonator 2420. The cap 2460 protects the resonator 2420. The cap 2460 may be formed of a material containing silicon (Si).

It will be confirmed below that attenuation performance of a resonator has a high value even when an insertion layer is formed of a conductive material, as in an embodiment of an elastic wave filter device of FIGS. 16 to 20.

Figure 21:
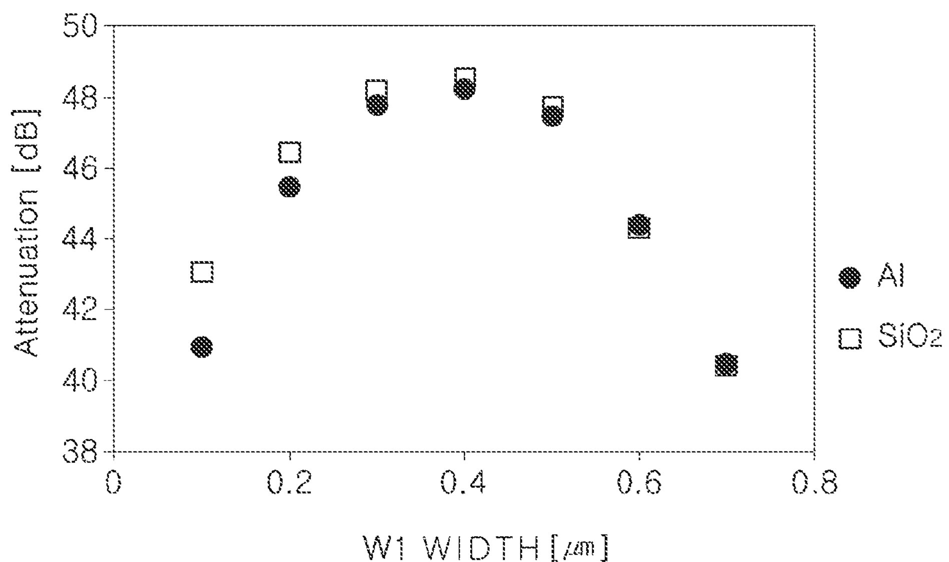
FIG. 21 is a graph illustrating attenuation performances according to widths W1 of insertion layers formed of different materials in a bulk-acoustic resonator according to FIG. 1 and an elastic wave filter device according to FIG. 16.

FIG. 21 is a graph illustrating attenuation performance according to a width W1 of an insertion layer in a bulk-acoustic resonator according to the embodiment of FIG. 1.

In this example, attenuation performance is represented for cases in which a thickness T1 of the insertion layer is 0.3 μm, and materials of the insertion layer are a material containing aluminum (Al) and a material a material containing silicon oxide ($SiO_2$).

As shown in FIG. 21, when a width W1 of an insertion layer is about 0.4 μm, attenuation performance in a case in which a material of the insertion layer is a conductive material containing aluminum (Al) has a high value similar to that of a case in which a material of the insertion layer is a material containing silicon oxide ($SiO_2$).

Figure 22:
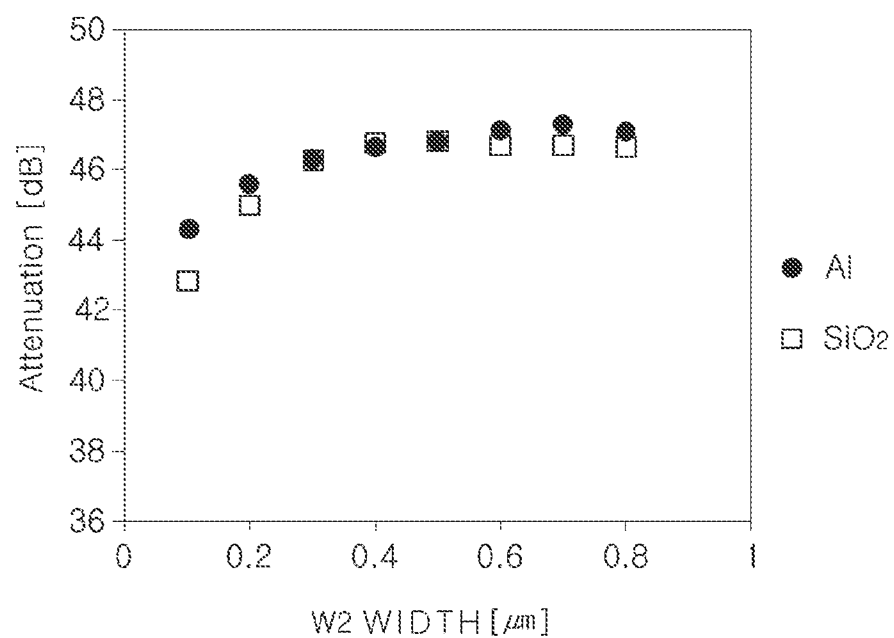
FIG. 22 is a graph illustrating attenuation performances according to widths W2 of insertion layers formed of different materials in a bulk-acoustic resonator according to FIG. 1 and an elastic wave filter device according to FIG. 16.

FIG. 22 is a graph illustrating attenuation performance according to a width W2 of an insertion layer in a bulk-acoustic resonator according to the embodiment of FIG. 1.

In this example, attenuation performance is represented for cases in which a thickness T3 of the insertion layer is 0.1 μm, and materials of the insertion layer are a material containing aluminum (Al) and a material containing silicon oxide ($SiO_2$).

As shown in FIG. 22, when a width W2 of an insertion layer is about 0.5 μm to 0.8 μm, attenuation performance in a case in which a material of the insertion layer is a conductive material containing aluminum (Al) has a high value similar to that of a case in which a material of the insertion layer is a material containing silicon oxide ($SiO_2$).

Figure 23:
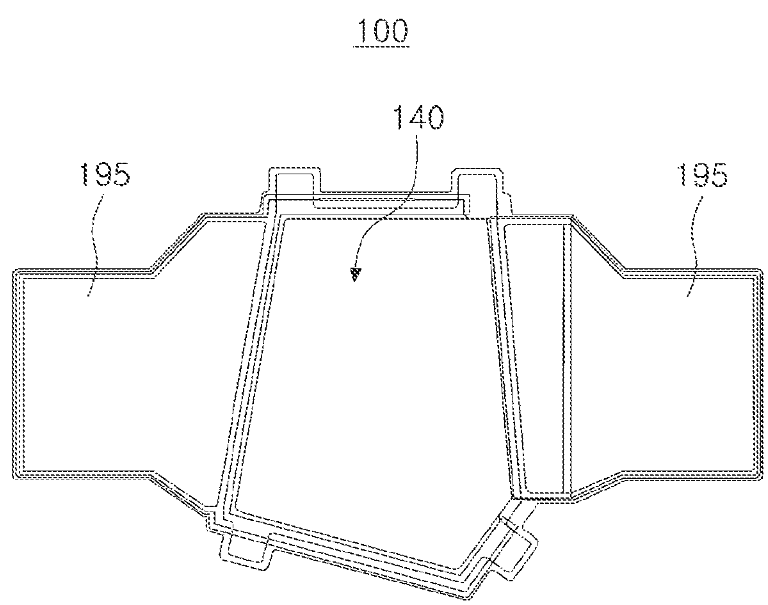
FIG. 23 is a plan view illustrating a bulk-acoustic resonator having an atypical polygonal shape, according to an embodiment.

The configurations of the bulk-acoustic resonators described above may be applied to a bulk-acoustic resonator having an atypical polygonal shape illustrated in FIG. 23. In addition, in FIG. 23, the bulk-acoustic resonator 140 includes a resonating portion 140. The resonating portion 140 is a region in which the first electrode 150, the piezoelectric layer 160, and the second electrode 170 overlap each other.

As set forth above, according to embodiments disclosed herein, a performance may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic resonator, comprising:
a substrate;
a first electrode disposed on an upper portion of the substrate;
a piezoelectric layer disposed to at least partially cover the first electrode, and comprising a flat portion disposed in a central region of the bulk-acoustic resonator, and an extension portion disposed outside the flat portion and having at least one step portion;
an insertion layer disposed on the extension portion; and
a second electrode disposed on upper portions of the insertion layer and the piezoelectric layer,
wherein the extension portion comprises at least one first surface and at least one second surface disposed below an upper surface of the flat portion, and a connection surface connecting an upper surface of the flat portion to the at least one first surface or the at least one second surface, or connecting first surfaces among the at least one first surface to each other or second surfaces among the at least one second surface to each other,
wherein the at least one first surface comprises one first surface having a step portion with an upper surface of the flat portion, and another first surface disposed below the one first surface and having a step portion with the one first surface, and
wherein a separation distance between the one first surface and the other first surface in a thickness direction of the bulk-acoustic resonator is equal to less than a thickness obtained by subtracting a thickness of a portion of the insertion layer disposed at an end of the second electrode from a thickness of the piezoelectric layer.

2. The bulk-acoustic resonator of claim 1, wherein a width of a portion of the insertion layer disposed at an end of the second electrode is equal to or less than 1 μm.

3. The bulk-acoustic resonator of claim 1, wherein a thickness of a portion of the insertion layer disposed at an end of the second electrode is equal to or less than half a thickness of the piezoelectric layer.

4. The bulk-acoustic resonator of claim 1, wherein an end of the insertion layer disposed at an end of the second electrode is disposed on the one first surface.

5. The bulk-acoustic resonator of claim 1, wherein a portion of the insertion layer disposed at an end of the second electrode is formed to extend to the other first surface.

6. The bulk-acoustic resonator of claim 1, wherein the connection surface comprises a first connection surface connecting an upper surface of the flat portion to the one first surface, and a second connection surface connecting the one first surface to the other first surface, and wherein a portion of the insertion layer disposed at an end of the second electrode is formed to extend to the second connection surface.

7. The bulk-acoustic resonator of claim 6, wherein an end of the insertion layer disposed at an end of the second electrode is disposed on the first surface.

8. The bulk-acoustic resonator of claim 1, wherein an end of the insertion layer disposed at an end of the second electrode is disposed at an end of the one first surface.

9. The bulk-acoustic resonator of claim 1, further comprising a protective layer disposed on at least the flat portion of the piezoelectric layer.

10. The bulk-acoustic resonator of claim 1, wherein the second surface comprises one second surface having a step portion with an upper surface of the flat portion, and another second surface disposed below the one second surface and having a step portion with the one second surface, and wherein a separation distance between the one second surface and the other second surface in a thickness direction is equal to or less than a thickness obtained by subtracting a thickness of a portion of the insertion layer disposed at an end of the second electrode from a thickness of the piezoelectric layer.

11. The bulk-acoustic resonator of claim 9, wherein an end of one side of the protective layer is disposed to cover ends of the second electrode and the insertion layer.

12. The bulk-acoustic resonator of claim 9, wherein an end of one side of the protective layer is aligned with ends of the second electrode and the insertion layer.

13. The bulk-acoustic resonator of claim 9, wherein an end of one side of the protective layer is disposed on the second electrode.

14. The bulk-acoustic resonator of claim 1, wherein a portion of the insertion layer disposed at an end of the second electrode is disposed to be spaced apart from the piezoelectric layer.

15. The bulk-acoustic resonator of claim 14, wherein a width of a portion of the insertion layer disposed at an end of the second electrode is equal to or less than 1 μm.

16. The bulk-acoustic resonator of claim 10, wherein a width of a portion of the insertion layer disposed on a portion of the one second surface disposed on an upper portion of an end of the first electrode is equal to or less than 1 μm.

17. An elastic wave filter device, comprising:

a substrate;

a first resonator comprising one first electrode disposed on an upper portion of the substrate, a first piezoelectric layer comprising a first flat portion disposed to at least partially cover the one first electrode and disposed in a central portion of the first resonator, and a first extension portion disposed outside the first flat portion and having at least one step portion, and one second electrode disposed on an upper portion of the first piezoelectric layer;

a second resonator comprising another first electrode disposed on the upper portion of the substrate, a second piezoelectric layer comprising a second flat portion disposed to at least partially cover the other first electrode and disposed in a central portion of the second resonator, and a second extension portion disposed outside the second flat portion and having at least one other step portion, and another second electrode disposed on an upper portion of the second piezoelectric layer; and an insertion layer disposed in upper portions of the first and second extension portions and between the first piezoelectric layer and the second piezoelectric layer, and formed of a conductive material.

18. The elastic wave filter device of claim 17, wherein a portion of the insertion layer disposed between the first piezoelectric layer and the second piezoelectric layer connects the one first electrode to the other first electrode.

19. The elastic wave filter device of claim 17, wherein a portion of the insertion layer disposed between the first piezoelectric layer and the second piezoelectric layer connects the one second electrode to the other first electrode.

20. The elastic wave filter device of claim 17, wherein a portion of the insertion layer disposed between the first piezoelectric layer and the second piezoelectric layer is connected to the one second electrode and the other second electrode.

* * * * *